United States Patent
Kanda et al.

(10) Patent No.: US 6,638,804 B2
(45) Date of Patent: Oct. 28, 2003

(54) METHOD OF MANUFACTURING SEMICONDUCTOR DEVICE WITH HIGH AND LOW BREAKDOWN TRANSISTORS

(75) Inventors: Atsushi Kanda, Suwa (JP); Yasushi Haga, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/271,536

(22) Filed: Oct. 17, 2002

(65) Prior Publication Data

US 2003/0077865 A1 Apr. 24, 2003

(30) Foreign Application Priority Data

Oct. 19, 2001 (JP) .......................................... 2001-321559

(51) Int. Cl.⁷ .......................................... H01L 21/8238
(52) U.S. Cl. ......................... 438/200; 438/275; 438/595
(58) Field of Search ................................ 438/200, 230, 438/231, 275, 595, 655

(56) References Cited

U.S. PATENT DOCUMENTS

| | | | | |
|---|---|---|---|---|
| 5,472,887 A | * | 12/1995 | Hutter et al. | 438/275 |
| 5,786,252 A | * | 7/1998 | Ludikhuize et al. | 438/275 |
| 6,010,929 A | * | 1/2000 | Chapman | 438/275 |
| 6,165,825 A | * | 12/2000 | Odake | 438/275 |
| 6,514,839 B1 | * | 2/2003 | Ker et al. | 438/199 |

* cited by examiner

*Primary Examiner*—Chandra Chaudhari
(74) *Attorney, Agent, or Firm*—Oliff & Berridge, PLC

(57) ABSTRACT

Among first and second oxide films 110 and 112 formed on a substrate 100, the oxide film in a low-breakdown-voltage transistor area LV is all etched off, while the whole surface of the oxide film in a high-breakdown-voltage transistor area HV is left intact. A sixth oxide film 119 to define a side wall is subsequently formed on the whole surface of the substrate 100, and a resist R17 is formed over the whole high-breakdown-voltage transistor area HV. Over-etching of the low-breakdown-voltage transistor area LV is carried out to make the surface of the substrate 100 exposed and to define the side wall only in the low-breakdown-voltage transistor area LV. The oxide film 119 is made to remain in the high-breakdown-voltage transistor area HV. Non-required portions of the oxide films 119 and 112 are then etched off with a resist R15B. This causes a drain-source forming region, which is expected to form a drain area and a source area, to be open in an element forming region in a high-breakdown-voltage nMOS area HVn. The resist R15B is not removed but is used continuously, and an n-type impurity ion is implanted into the open drain-source forming region. This arrangement enables both a high-breakdown-voltage MOS transistor and a low-breakdown-voltage MOS transistor to be formed efficiently on an identical substrate without damaging the characteristics of the respective MOS transistors.

5 Claims, 41 Drawing Sheets

Fig. 11

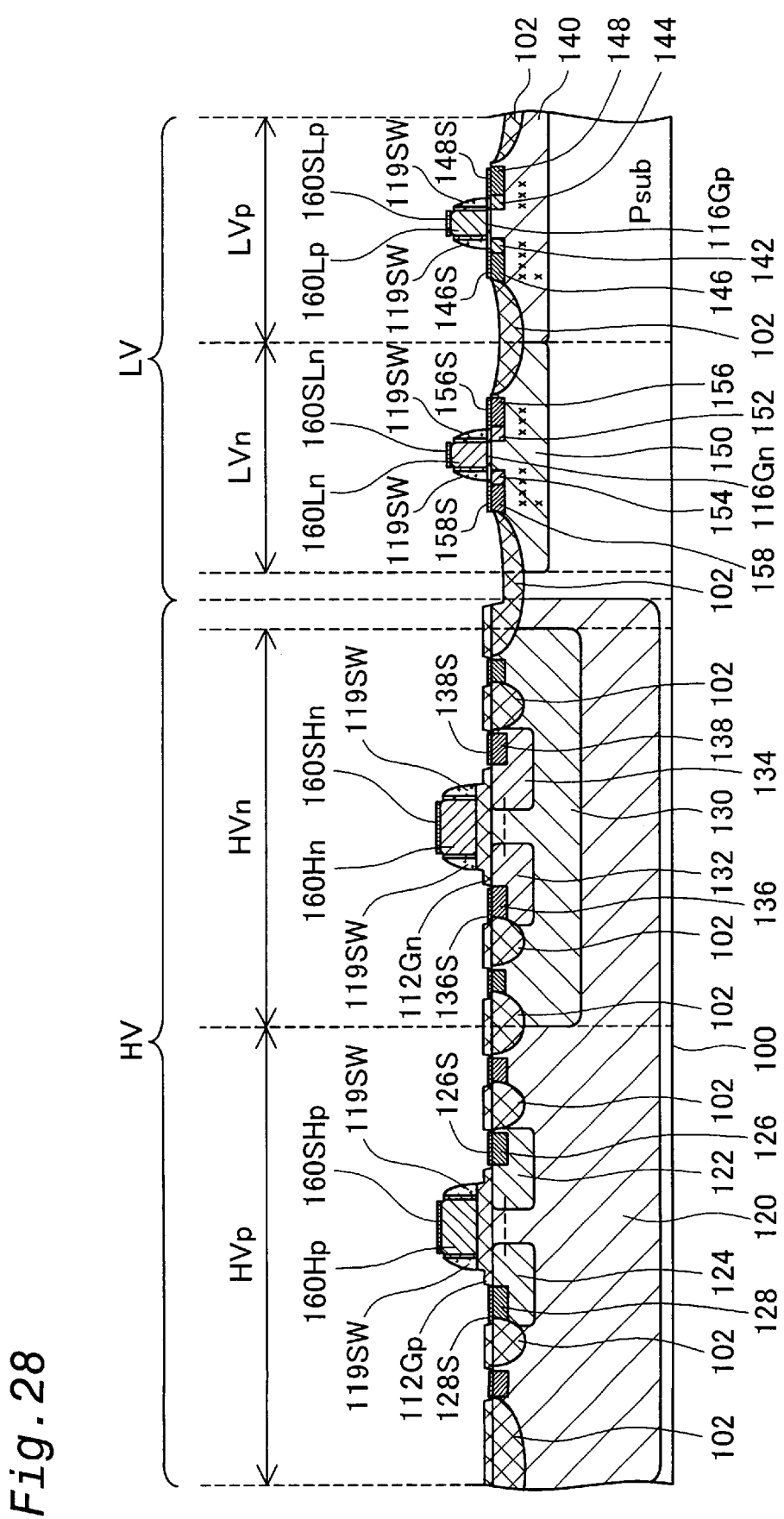

METHOD OF MANUFACTURING SEMICONDUCTOR DEVICE WITH HIGH AND LOW BREAKDOWN TRANSISTORS

BACKGROUND OF THE INVENTION

1. Field of the Invention

The present invention relates to a method of manufacturing a semiconductor device, in which both a high-breakdown-voltage MOS (Metal Oxide Semiconductor) transistor and a low-breakdown-voltage MOS transistor having different drain breakdown voltages are formed on an identical substrate, and also to a semiconductor device manufactured by this method.

2. Description of the Related Art

An integrated circuit for actuating, for example, an imaging element, an LCD (Liquid Crystal Display), or a print head (hereinafter referred to as the 'actuation IC') generally includes an actuation output module with a high-breakdown-voltage MOS transistor, which is driven by a power supply voltage of 10 or greater volts and has a high withstand voltage between a drain and a source (hereinafter may be referred to as the 'drain breakdown voltage'), and a logic module with a low-breakdown-voltage MOS transistor, which is driven by a power supply voltage of several or less volts and has a low drain breakdown voltage, for controlling the actuation output module. In the description below, the MOS transistor may be simply called the transistor.

In the actuation IC, it is preferable that the high-breakdown-voltage transistor and the low-breakdown-voltage transistor are formed on an identical substrate. The simplest method of forming such transistors of different withstand voltages on an identical substrate is to separately form the respective transistors according to different processes. The method first forms one of the high-breakdown-voltage transistor and the low-breakdown-voltage transistor on a substrate, and subsequently forms the other transistor on the same substrate.

The method of separately forming the high-breakdown-voltage transistor and the low-breakdown-voltage transistor, however, significantly increases the total number of manufacturing steps, thus worsening the production efficiency and increasing the manufacturing cost.

There is accordingly a demand for efficiently forming both a high-breakdown-voltage transistor and a low-breakdown-voltage transistor on an identical substrate without damaging the characteristics of the respective transistors.

SUMMARY OF THE INVENTION

The object of the present invention is thus to solve the drawback of the prior art technique discussed above and to provide a technique of efficiently forming both a high-breakdown-voltage transistor and a low-breakdown-voltage transistor on an identical substrate without damaging the characteristics of the respective transistors.

In order to attain at least part of the above and the other related objects, the present invention is directed to a method of manufacturing a semiconductor device, in which both a high-breakdown-voltage MOS transistor and a low-breakdown-voltage MOS transistor having different drain breakdown voltages are formed on an identical semiconductor substrate. The manufacturing method includes the steps of: (a) forming a gate electrode on a first dielectric film created above the substrate; (b) forming a side wall on a side face of the gate electrode; and (c) implanting an impurity to define a drain area and a source area. The step (b) has the sub-steps of: (b-1) creating a second dielectric film on surface of the substrate including the gate electrode; (b-2) forming a first mask, which covers a specific area corresponding to the high-breakdown-voltage MOS transistor; and (b-3) using the first mask and etching the second dielectric film, which is located on a certain area corresponding to the low-breakdown-voltage MOS transistor, out of the dielectric films created on the substrate, so as to form the side wall of the second dielectric film on the side face of the gate electrode in the low-breakdown-voltage MOS transistor.

The manufacturing method of the present invention enables both the high-breakdown-voltage MOS transistor and the low-breakdown-voltage MOS transistor to be efficiently formed on an identical substrate. In the process of forming the side wall, the specific area corresponding to the high-breakdown-voltage MOS transistor is covered with the first mask. Such coverage effectively prevents the second dielectric film in a neighborhood of the gate electrode in the high-breakdown-voltage MOS transistor from being undesirably thinned even in the case of over-etching to form the side wall in the low-breakdown-voltage MOS transistor. This effectively prevents the impurity from being implanted into a lower layer of the first dielectric film in the vicinity of the gate electrode in the high-breakdown-voltage MOS transistor to define the drain area and the source area or to silicidate the surface area of the lower layer. The arrangement does not cause a decrease in drain breakdown voltage nor damages the breakdown voltage characteristics of the high-breakdown-voltage MOS transistor.

In accordance with one preferable application of the manufacturing method of the invention, the step (c) has the sub-steps of: (c-1) forming a second mask that keeps open at least a drain-source forming region in the high-breakdown-voltage MOS transistor, which is expected to form the drain area and the source area, and the gate electrode but covers at least an offset forming region in the high-breakdown-voltage MOS transistor, which is expected to form an offset area between the gate electrode and either one of the drain area and the source area; (c-2) using the second mask and etching off at least the first and the second dielectric films located on the drain-source forming region and the second dielectric film located on the gate electrode, out of the dielectric films created on the substrate; and (c-3) continuously using the second mask and implanting the impurity into at least the drain-source forming region and the gate electrode.

In this preferable application, the second mask is used to prevent the impurity from being implanted into the lower layer of the first dielectric film in the vicinity of the gate electrode in the high-breakdown-voltage MOS transistor in the process of impurity implantation.

The procedure of this application uses the first mask and etches off the first dielectric film and the second dielectric film on the drain-source forming region in the high-breakdown-voltage MOS transistor. The procedure does not remove the first mask but continuously uses the same mask and implants the impurity into the drain-source forming region. This arrangement effectively prevents a positional shift of the mask and ensures accurate implantation of the impurity into the drain-source forming region.

In the above application, it is preferable that the sub-step (c-1) forms the second mask that covers an element forming region in the low-breakdown-voltage MOS transistor, which is expected to form an element, in addition to the offset forming region. The step (c) further has the sub-steps of (c-4) forming a third mask, which keeps open at least the element forming region in the low-breakdown-voltage MOS transistor; and (c-5) using the third mask and implanting the impurity into at least the element forming region.

The second mask, which covers the element forming region in the low-breakdown-voltage MOS transistor, is used in the process of etching off the first and the second dielectric films on the drain-source forming region in the high-breakdown-voltage MOS transistor. The element forming region in the low-breakdown-voltage MOS transistor is thus not affected by the etching. There is accordingly no possibility that part of the side wall is etched off in the low-breakdown-voltage MOS transistor.

In the above application, it is preferable that the manufacturing method further has the step of: (d) forming a metal film on the gate electrode, the drain area, and the source area and carrying out heat treatment, so that at least part of semiconductor layers constructing the gate electrode, the drain area, and the source area is fused to a metal of the metal film and is thereby silicidated.

On conclusion of the step (c), in the high-breakdown-voltage MOS transistor, the first dielectric film in the vicinity of the gate electrode is covered with and protected by the second dielectric film. The subsequent silicidation process of the step (d) accordingly does not silicidate the semiconductor in the lower layer of the first dielectric film in the vicinity of the gate electrode. This arrangement effectively prevents a decrease in drain breakdown voltage due to silicidation of the semiconductor in the lower layer, thus not damaging the voltage breakdown characteristics of the high-breakdown-voltage MOS transistor.

These and other objects, features, aspects, and advantages of the present invention will become more apparent from the following detailed description of the preferred embodiment with the accompanying drawings.

BRIEF DESCRIPTION OF THE DRAWINGS

FIG. 11 is a sectional view schematically illustrating a process of forming a gate oxide film of the high-breakdown-voltage transistor;

FIG. 28 is a sectional view schematically illustrating the silicidation process;

DESCRIPTION OF THE PREFERRED EMBODIMENTS

One mode of carrying out the invention is discussed below as a preferred embodiment in the following sequence:
A. Prerequisite Basic Manufacturing Method
B. Structural Problems of High-breakdown-voltage Transistor Manufactured According to Basic Manufacturing Method
C. Manufacturing Method of Embodiment
  A. Prerequisite Basic Manufacturing Method A basic manufacturing method of a semiconductor device is described first, as a prerequisite for discussing a method of manufacturing a semiconductor device according to the present invention. FIGS. 1 through 28 are sectional views schematically illustrating a basic manufacturing method, as a basis of a method of manufacturing a semiconductor device according to the present invention. This manufacturing method is an exemplified procedure of forming both a high-breakdown-voltage CMOS (Complimentary Metal Oxide Semiconductor) transistor and a low-breakdown-voltage CMOS transistor on an identical substrate. In the respective drawings, a region HV represents a high-breakdown-voltage transistor area, and a region LV represents a low-breakdown-voltage transistor area. A region HVp denotes a high-breakdown-voltage p-channel MOS transistor (hereinafter the p-channel MOS transistor is simply referred to as 'pMOS') area, and a region HVn denotes a high-breakdown-voltage n-channel MOS transistor (hereinafter the n-channel MOS transistor is simply referred to as 'nMOS') area. A region LVp denotes a low-breakdown-voltage pMOS area, and a region LVn denotes a low-breakdown-voltage nMOS area.

Figure 1:
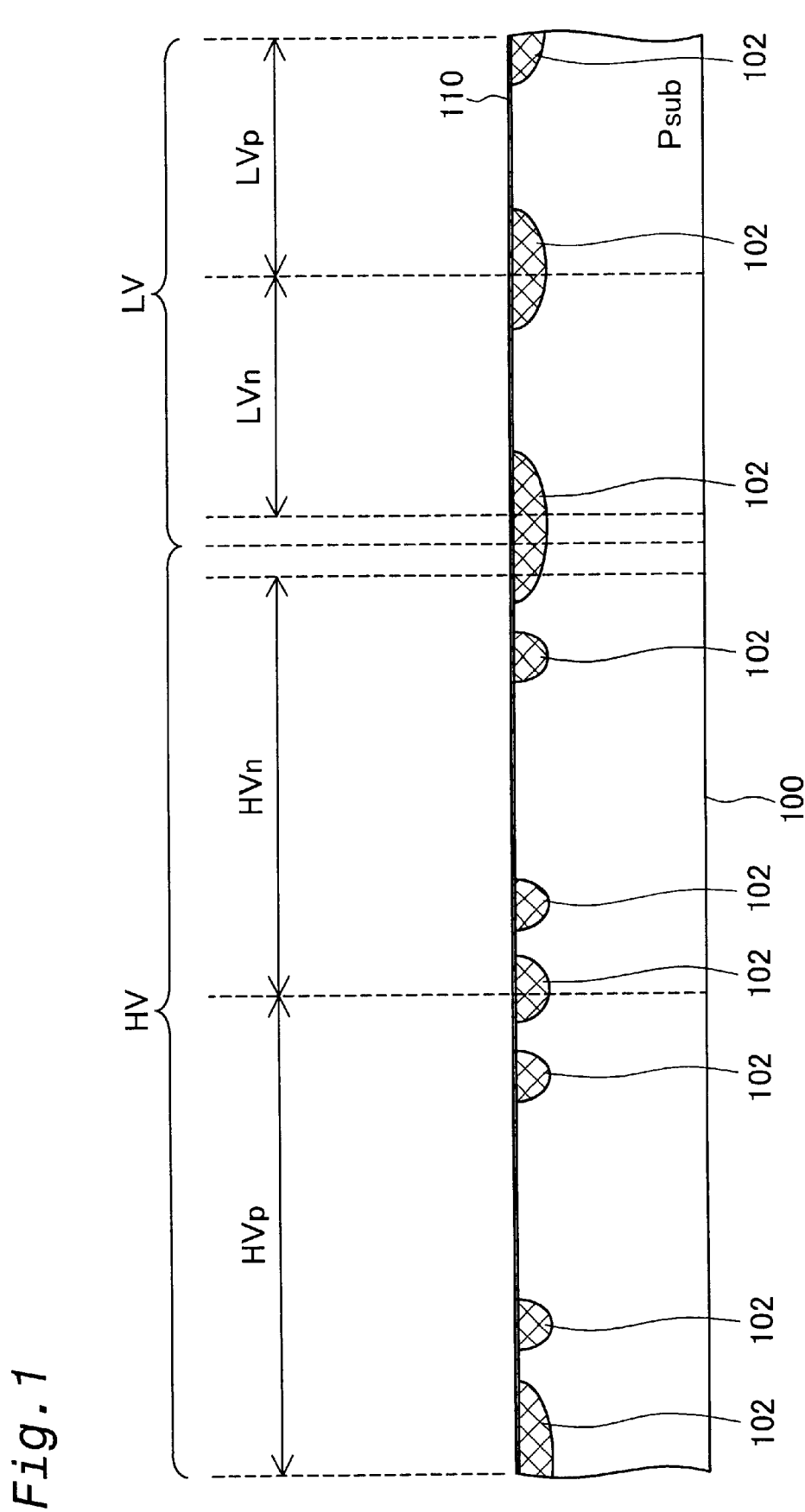
FIG. 1 is a sectional view schematically illustrating a process of forming a field oxide film on the surface of a field area.

The procedure first parts an element forming region from a residual part (hereinafter referred to as 'field part' or 'isolation part') on the semiconductor substrate and forms the element forming region in a restrictive manner. FIG. 1 is a sectional view schematically illustrating a process of forming a field oxide film on the surface of the field area. A field oxide film, LOCOS (Local Oxidation of Silicon) film 102 is formed on the surface of the field area of a p-type silicon (Si) substrate (Psub) 100 as shown in FIG. 1. In the description below, the p-type Si substrate is simply referred to as the 'substrate'. General photolithography is applied for formation of the LOCOS film 102. After formation of the LOCOS film 102, a first oxide film ($SiO_2$) 110 is formed over the whole surface of the substrate 100. The first oxide film 110 is formed, for example, by thermal oxidation of the surface of the substrate 100.

Figure 2:
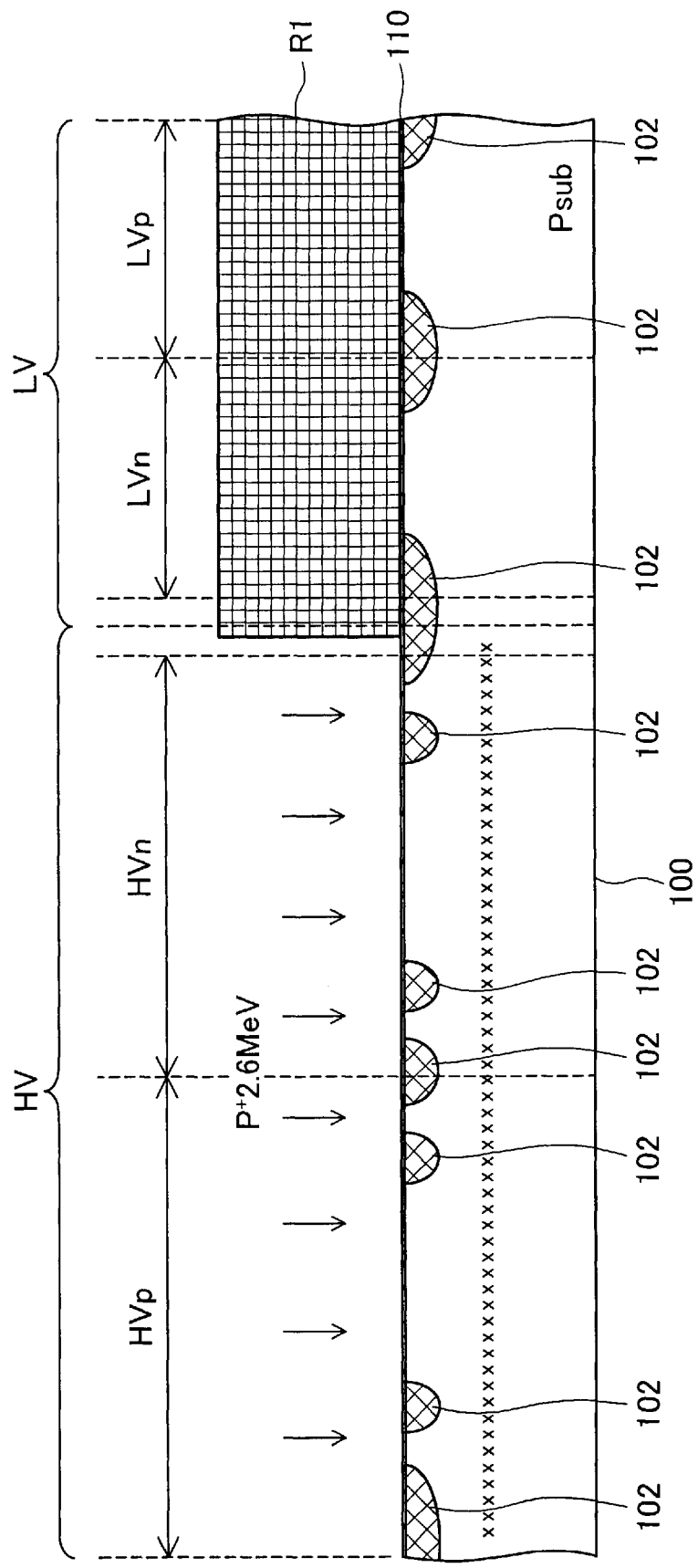
FIG. 2 is a sectional view schematically illustrating a process of forming an n well in a high-breakdown-voltage transistor area HV.
Figure 3:
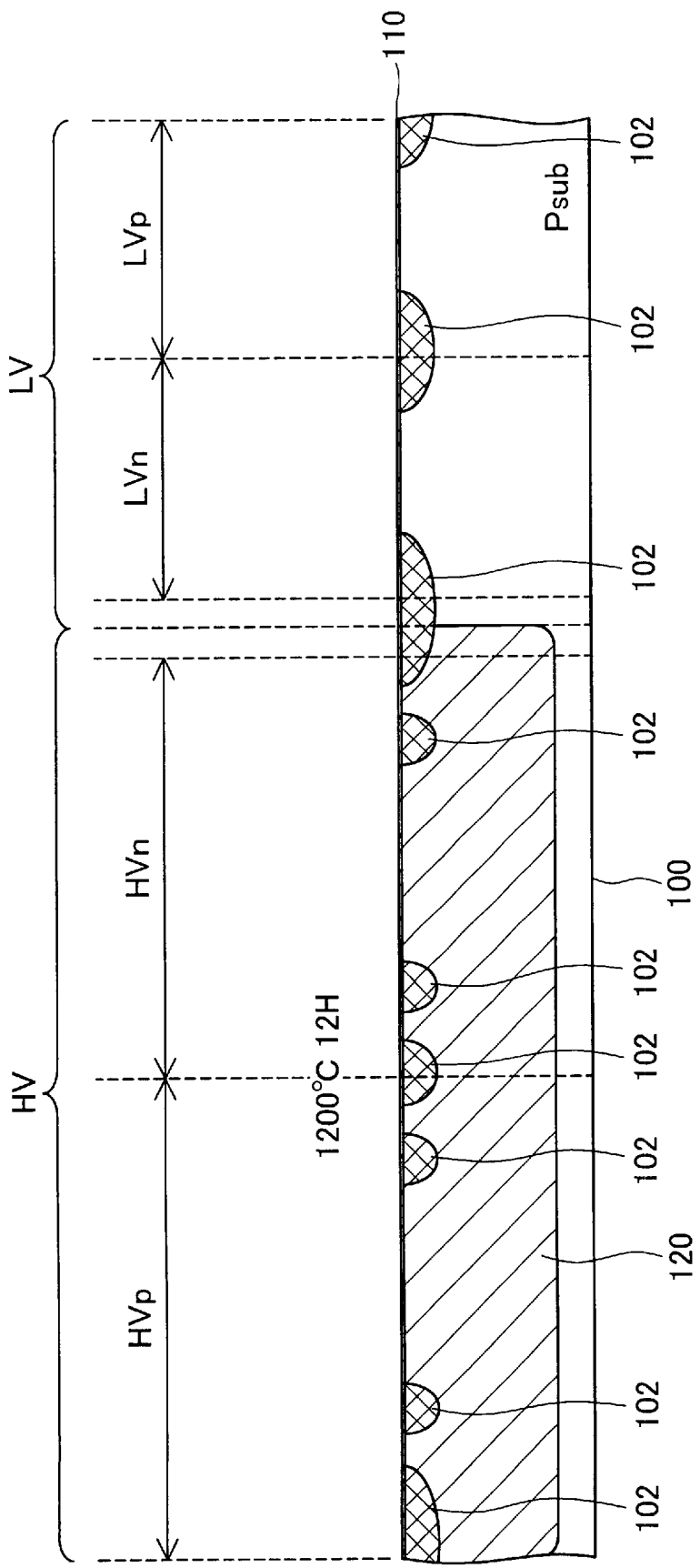
FIG. 3 is a sectional view schematically illustrating the process of forming the n well in the high-breakdown-voltage transistor area HV.

The procedure subsequently forms an n-type well (hereinafter simply referred to as 'n well') for formation of the high-breakdown-voltage pMOS in the high-breakdown-voltage transistor area HV. FIGS. 2 and 3 are sectional views schematically illustrating a process of forming an n well in the high-breakdown-voltage transistor area HV.

As shown in FIG. 2, the procedure forms a first resist RI on a remaining area other than the high-breakdown-voltage transistor area HV. The general photolithography is applied for formation of the resist. The procedure then implants an n-type impurity ion into the opening of the first resist RI, that is, into the substrate 100 in the high-breakdown-voltage transistor area HV. In this and subsequent drawings, the symbol 'x' represents the implanted impurity. In this example, phosphorus ion ($P^+$) having an energy level of 2.6 MeV is implanted. The procedure subsequently removes the first resist R1 and carries out high-temperature heat treatment for a long time period, so as to diffuse the implanted n-type impurity ion (phosphorus) in the substrate 100 and form an n well 120 as shown in FIG. 3. In this example, the heat treatment is carried out at 1200° C. for 12 hours.

Figure 4:
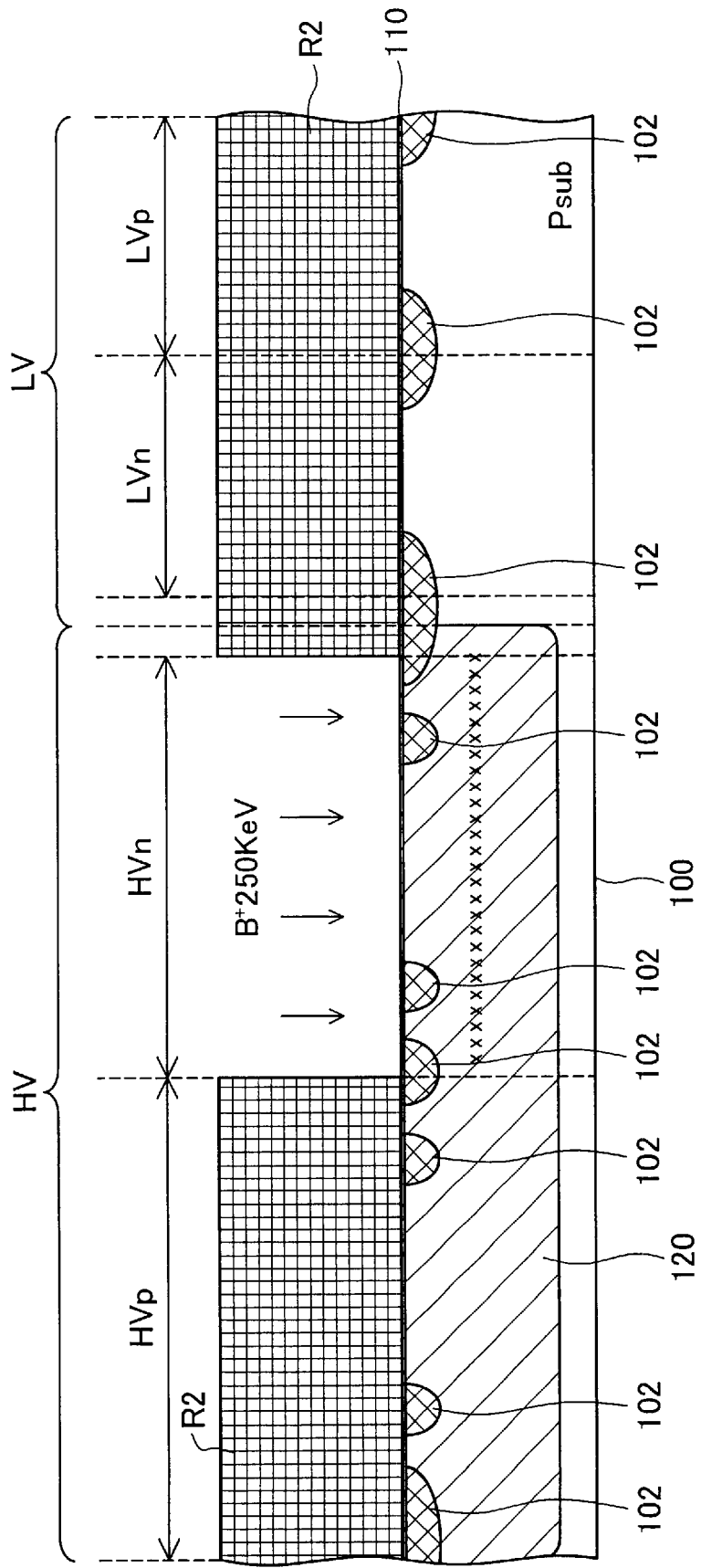
FIG. 4 is a sectional view schematically illustrating a process of forming a p well in the high-breakdown-voltage transistor area HV.
Figure 5:
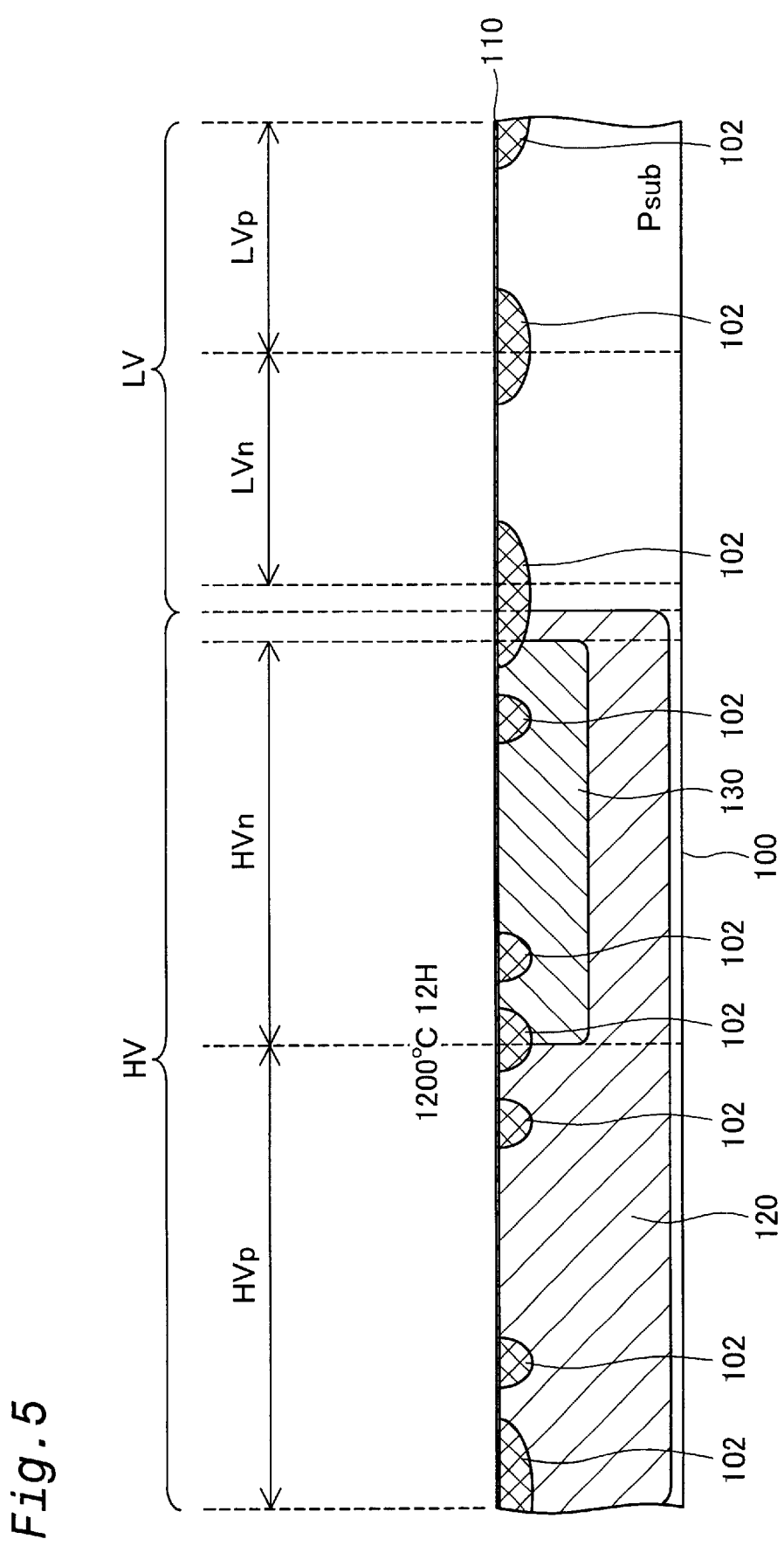
FIG. 5 is a sectional view schematically illustrating the process of forming the p well in the high-breakdown-voltage transistor area HV.

The procedure then forms a p-type well (hereinafter simply referred to as 'p well') for formation of the high-breakdown-voltage nMOS in the high-breakdown-voltage transistor area HV. FIGS. 4 and 5 are sectional views schematically illustrating a process of forming a p well in the high-breakdown-voltage transistor area HV.

As shown in FIG. 4, the procedure forms a second resist R2 on a remaining area other than the high-breakdown-voltage nMOS area HVn. The procedure then implants a p-type impurity ion into the opening of the second resist R2, that is, into the n well 120 in the high-breakdown-voltage nMOS area HVn. In this example, boron ion ($B^+$) having an energy level of 250 keV is implanted. The procedure subsequently removes the second resist R2 and carries out high-temperature heat treatment for a long time period, so as to diffuse the implanted p-type impurity ion (boron) in the n well 120 and form a p well 130 as shown in FIG. 5. In this example, the heat treatment is carried out at 1200° C. for 12 hours.

Figure 6:
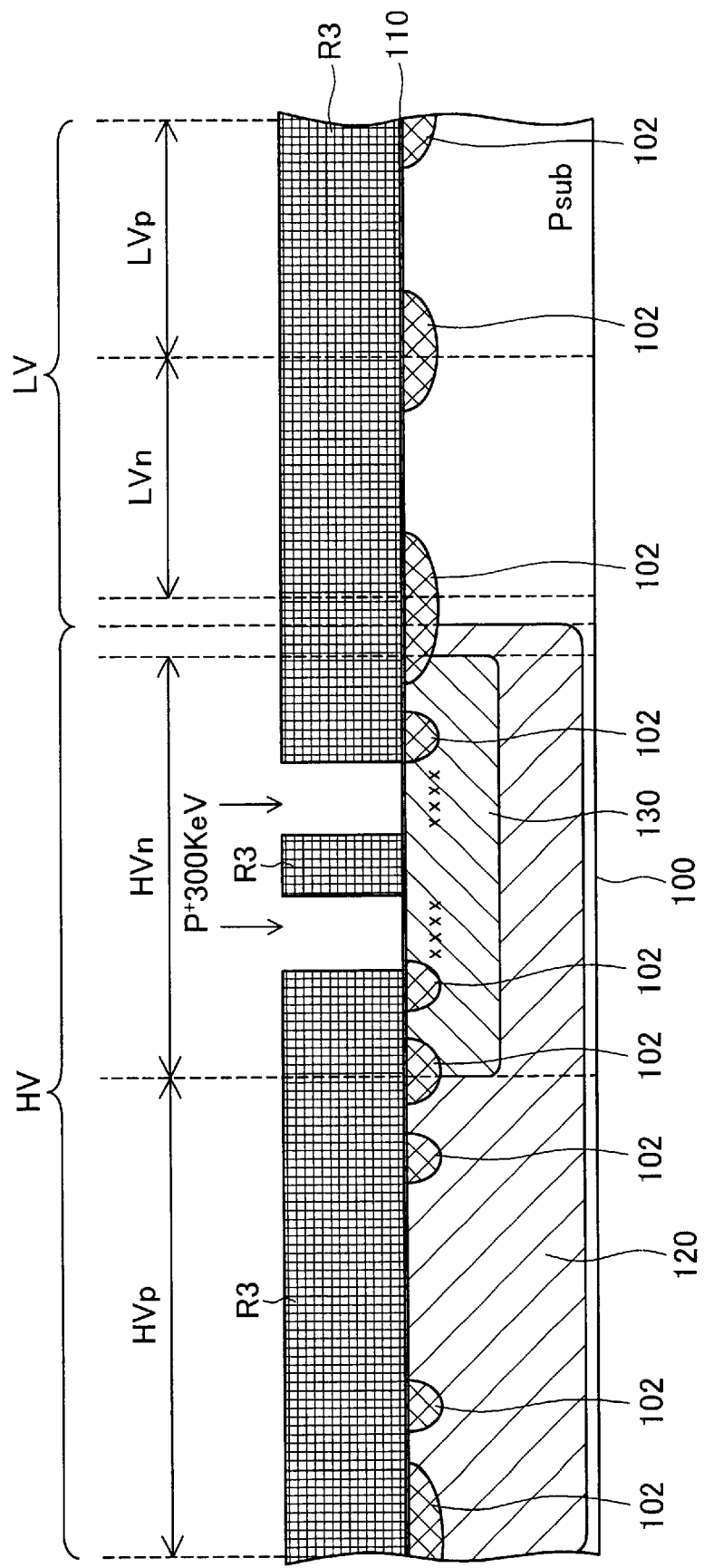
FIG. 6 is a sectional view schematically illustrating a process of forming drain and source offset areas of a high-breakdown-voltage transistor.
Figure 7:
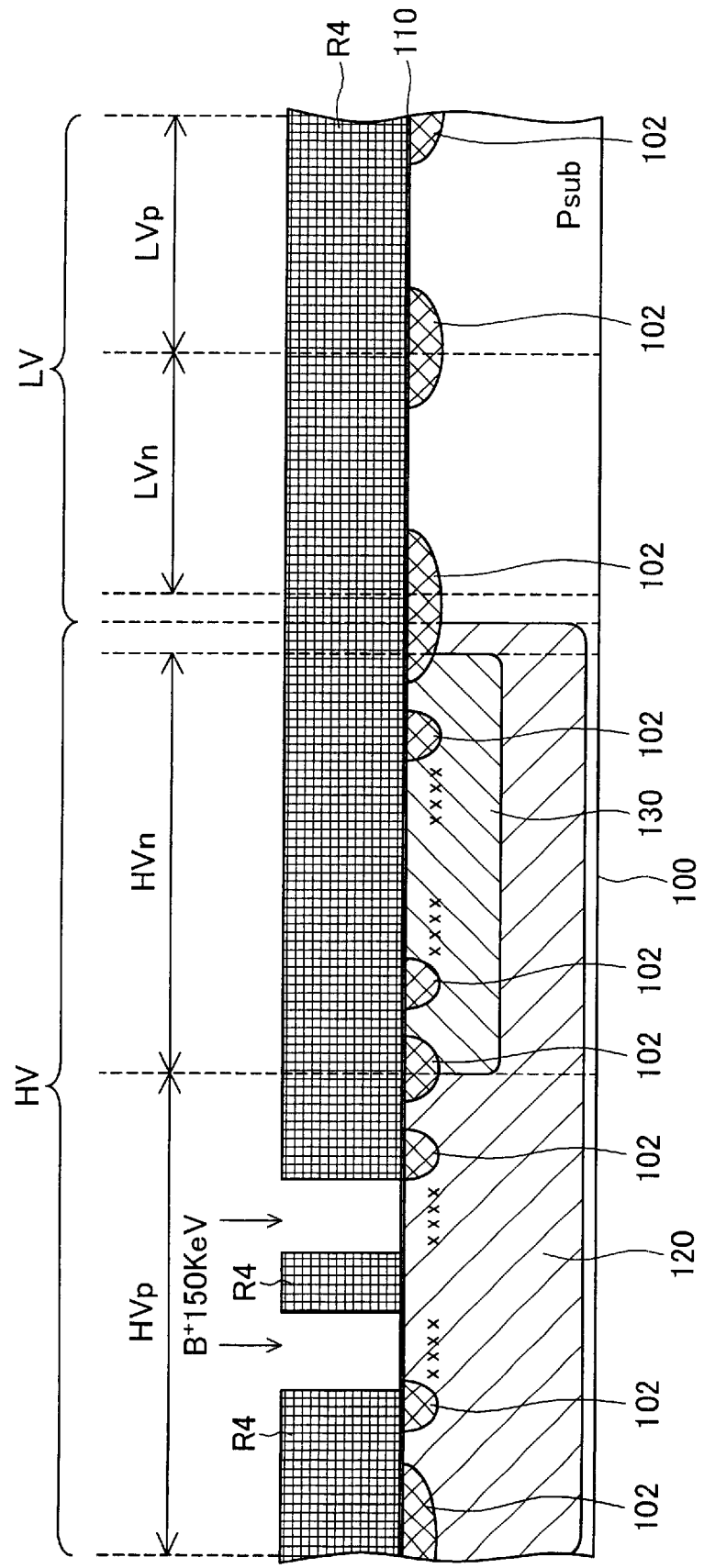
FIG. 7 is a sectional view schematically illustrating the process of forming the drain and source offset areas of the high-breakdown-voltage transistor.
Figure 8:
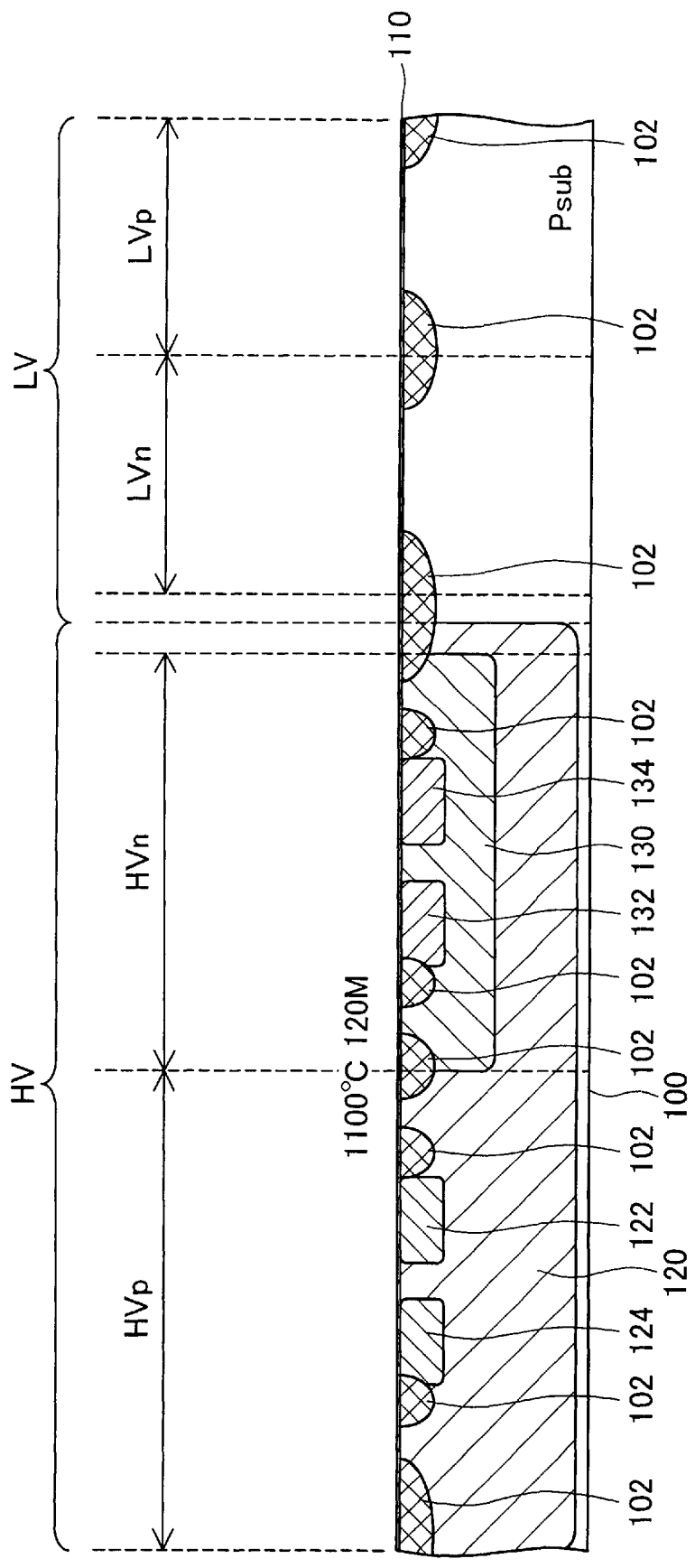
FIG. 8 is a sectional view schematically illustrating the process of forming the drain and source offset areas of the high-breakdown-voltage transistor.

The procedure then specifies a source offset area and a drain offset area (hereinafter may simply be referred to as 'offset area') for formation of a source area and a drain area of the high-breakdown-voltage transistor. FIGS. 6 through 8 are sectional views schematically illustrating a process of forming drain and source offset areas of the high-breakdown-voltage transistor.

Referring to FIG. 6, the procedure forms a third resist R3 on a remaining area other than specific parts corresponding to the drain and source offset areas of the high-breakdown-voltage nMOS. The procedure then implants an n-type impurity ion into the opening of the third resist R3, that is, into the p well 130 corresponding to the offset area of the high-breakdown-voltage nMOS. The third resist R3 is removed after the ion implantation. In this example, phosphorus ion ($P^+$) having an energy level of 300 keV is implanted.

Referring to FIG. 7, the procedure forms a fourth resist R4 on a remaining area other than specific parts corresponding to the drain and source offset areas of the high-breakdown-voltage pMOS. The procedure then implants a p-type impurity ion into the opening of the fourth resist R4, that is, into the n well 120 corresponding to the offset area of the high-breakdown-voltage pMOS. The fourth resist R4 is removed after the ion implantation. In this example, boron ion ($B^+$) having an energy level of 150 keV is implanted.

The ion implantation process shown in FIG. 6 and the ion implantation process shown in FIG. 7 may be carried out in the reverse order.

As shown in FIG. 8, the procedure carries out high-temperature heat treatment for a long time period to diffuse the implanted p-type impurity ion (boron) in the n well 120 and thereby define a drain offset area 122 and a source offset area 124 of the high-breakdown-voltage pMOS, while diffusing the implanted n-type impurity ion (phosphorus) in the p well 130 and thereby defining a drain offset area 132 and a source offset area 134 of the high-breakdown-voltage nMOS.

Figure 9:
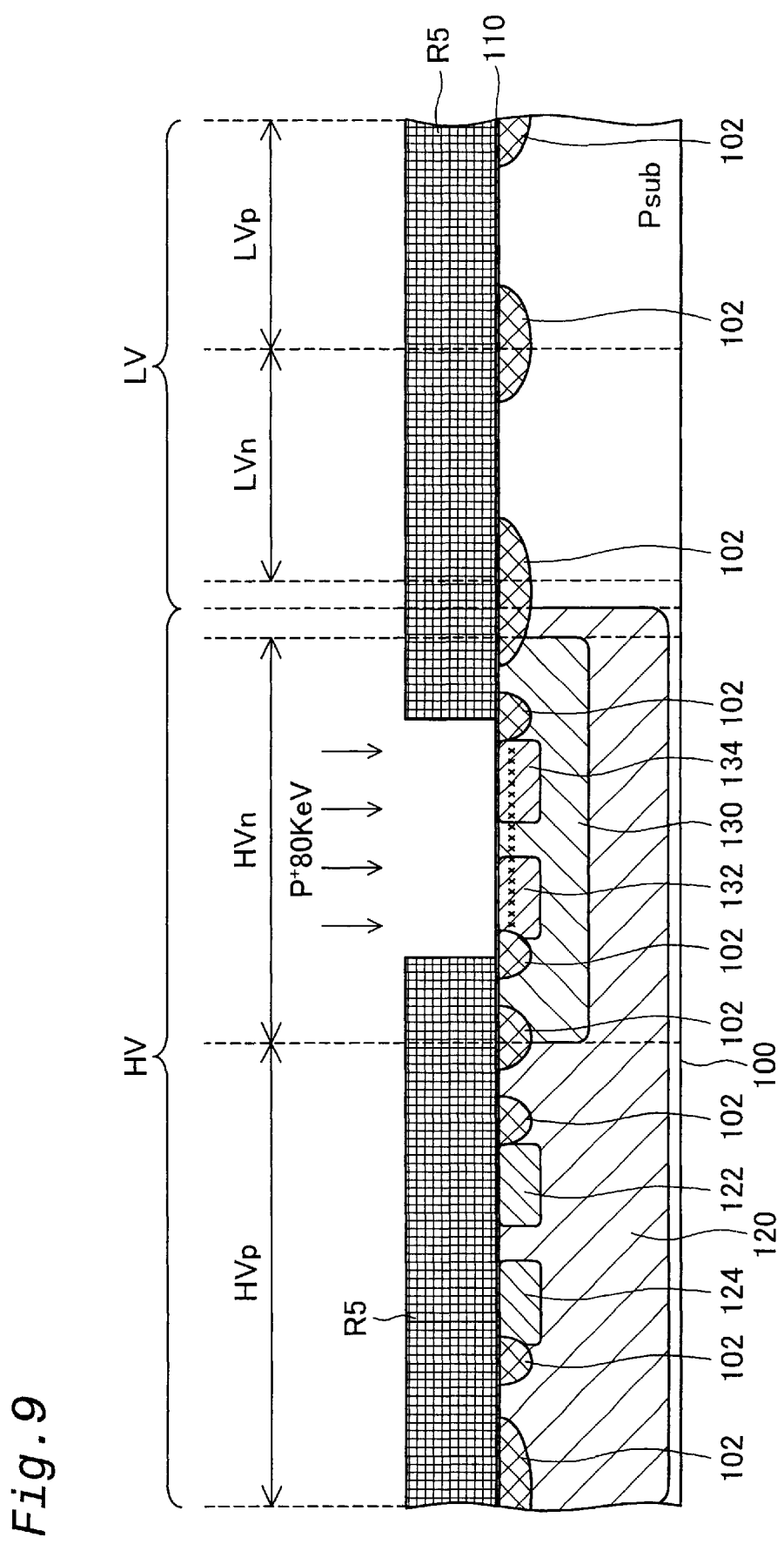
FIG. 9 is a sectional view schematically illustrating a process of implanting an n-type impurity ion into a channel area of a high-breakdown-voltage nMOS.
Figure 10:
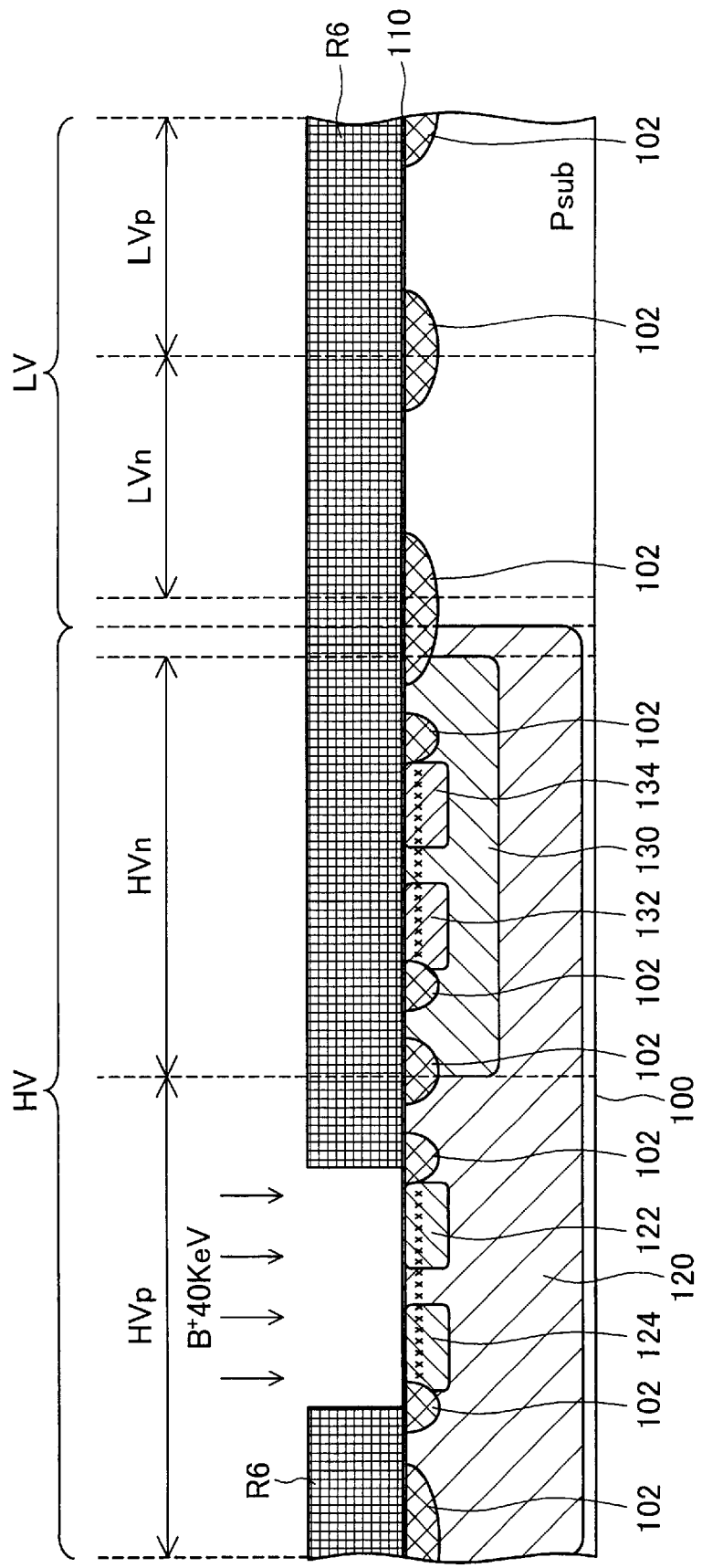
FIG. 10 is a sectional view schematically illustrating a process of implanting a p-type impurity ion into a channel area of a high-breakdown-voltage pMOS.

The procedure subsequently implants an impurity ion in a channel area, in order to regulate a threshold voltage of the high-breakdown-voltage transistor. FIG. 9 is a sectional view schematically illustrating a process of implanting an n-type impurity ion into a channel area of the high-breakdown-voltage nMOS. FIG. 10 is a sectional view schematically illustrating a process of implanting a p-type impurity ion into a channel area of the high-breakdown-voltage pMOS.

Referring to FIG. 9, the procedure forms a fifth resist R5 on a remaining area other than the high-breakdown-voltage nMOS area HVn, and implants an n-type impurity ion into the opening of the fifth resist R5, that is, into the channel area to regulate the threshold voltage of the high-breakdown-voltage nMOS. In this example, phosphorus ion ($P^+$) having an energy level of 80 keV is implanted. The fifth resist R5 is removed after the ion implantation.

Referring to FIG. 10, the procedure forms a sixth resist R6 on a remaining area other than the high-breakdown-voltage pMOS area HVp, and implants a p-type impurity ion into the opening of the sixth resist R6, that is, into the channel area to regulate the threshold voltage of the high-breakdown-voltage pMOS. In this example, boron ion ($B^+$) having an energy level of 40 keV is implanted. The sixth resist R6 is removed after the ion implantation.

The ion implantation process shown in FIG. 9 and the ion implantation process shown in FIG. 10 may be carried out in the reverse order.

Figure 11:
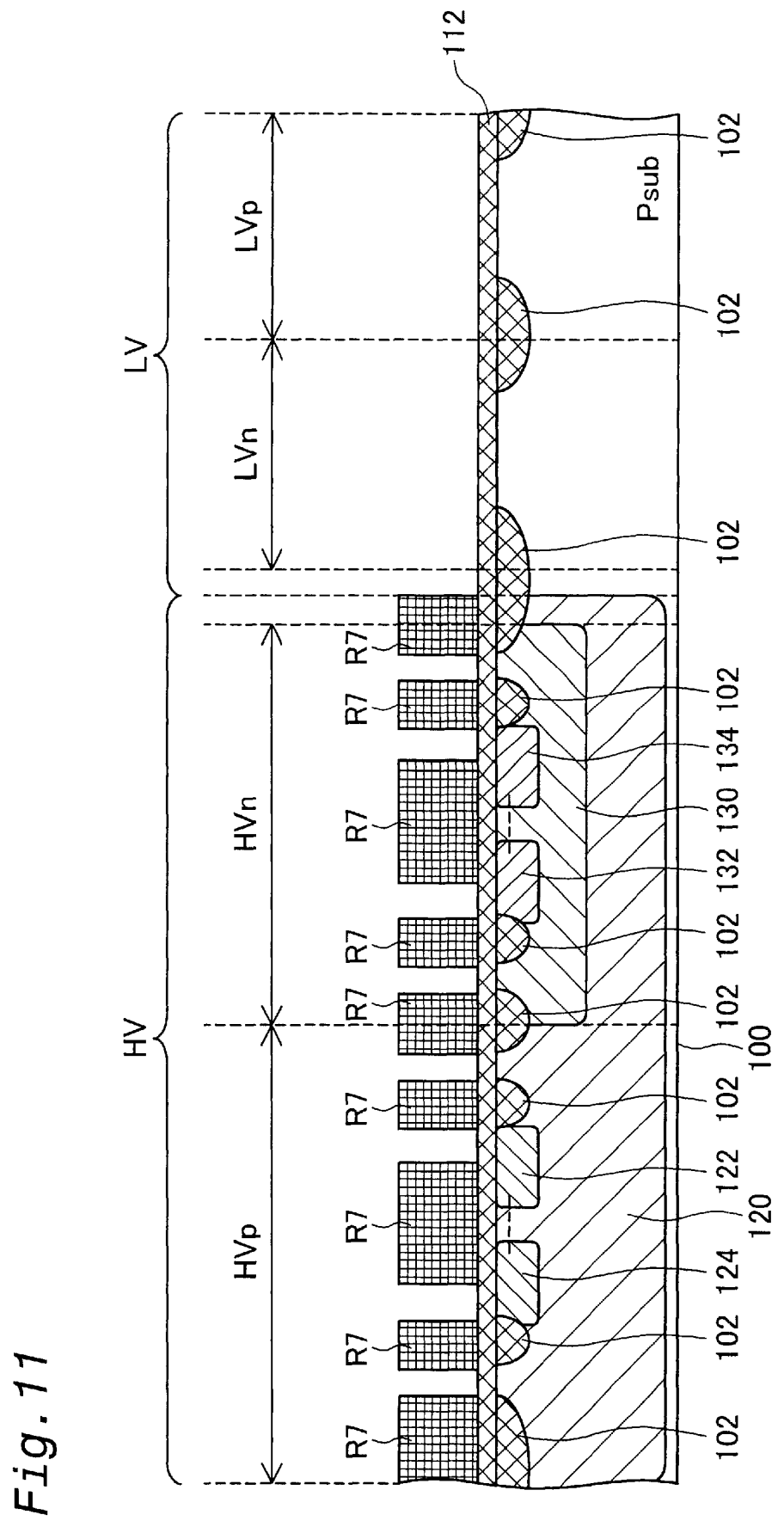
Figure 12:
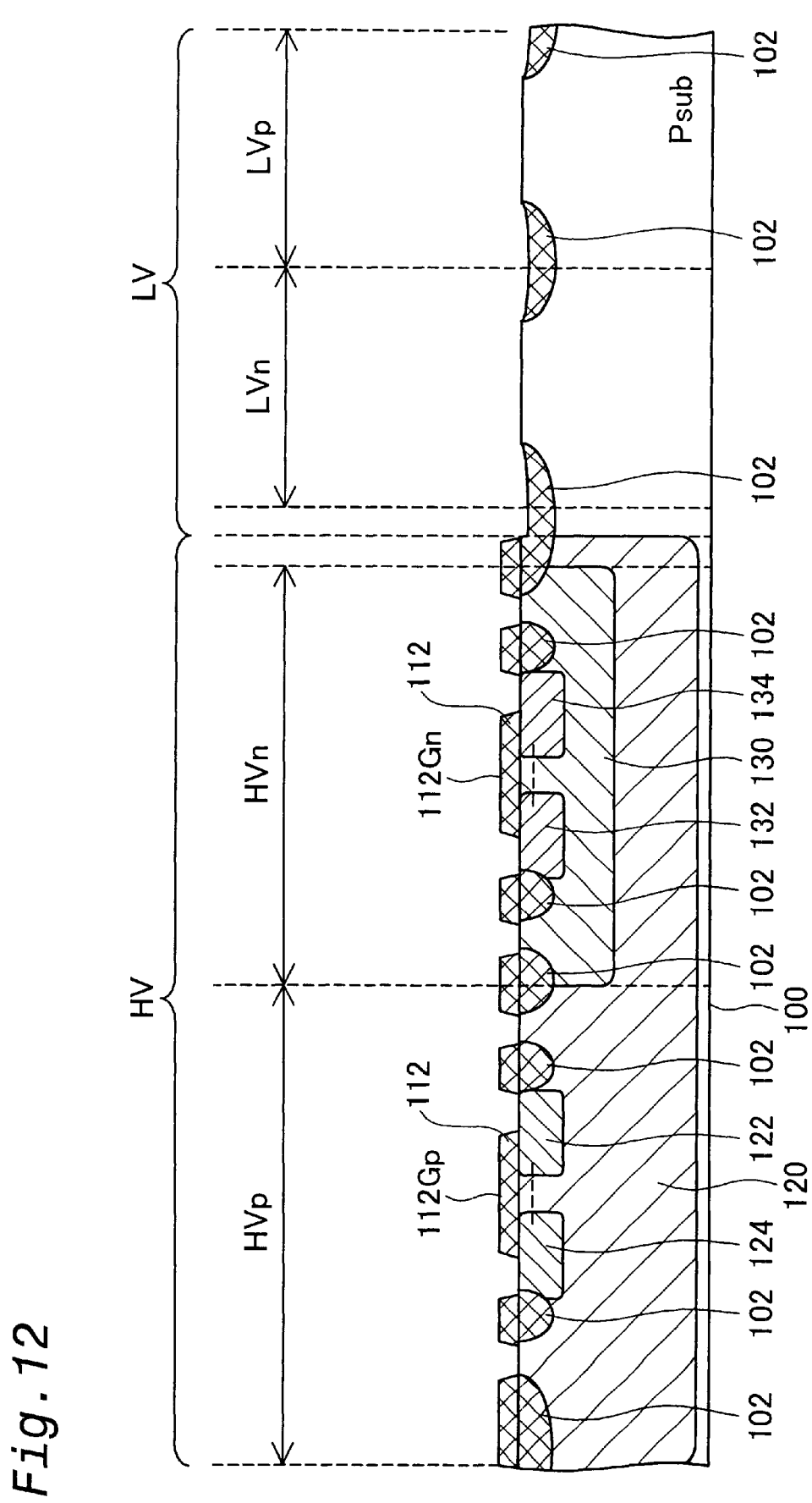
FIG. 12 is a sectional view schematically illustrating the process of forming the gate oxide film of the high-breakdown-voltage transistor.

The procedure subsequently forms a gate oxide film of the high-breakdown-voltage transistor. FIGS. 11 and 12 are sectional views schematically illustrating a process of forming a gate oxide film of the high-breakdown-voltage transistor.

As shown in FIG. 11, the procedure etches the whole surface to remove the first oxide film 110 and forms a second oxide film 112 by thermal oxidation as a gate oxide film of the high-breakdown-voltage transistor. The procedure subsequently forms a seventh resist R7 for protection of a required area as the gate oxide film, and etches off a non-required portion of the second oxide film 112 in the opening of the seventh resist R7. This gives a gate oxide film 112Gn for the high-breakdown-voltage nMOS and a gate oxide film 112Gp for the high-breakdown-voltage pMOS as shown in FIG. 12. In FIGS. 11 and 12 and subsequent drawings, the broken lines represent the channel areas of the high-breakdown-voltage nMOS and the high-breakdown-voltage pMOS.

Both of the gate oxide films 112Gp and 112Gn are composed of the second oxide film 112 formed by thermal oxidation. The final gate oxide film has a structure including another oxide film formed by thermal oxidation in the subsequent process. In this embodiment, the second oxide film 112 is formed by thermal oxidation to make the resulting gate oxide films 112Gp and 112Gn have a thickness of approximately 700 angstrom.

Figure 13:
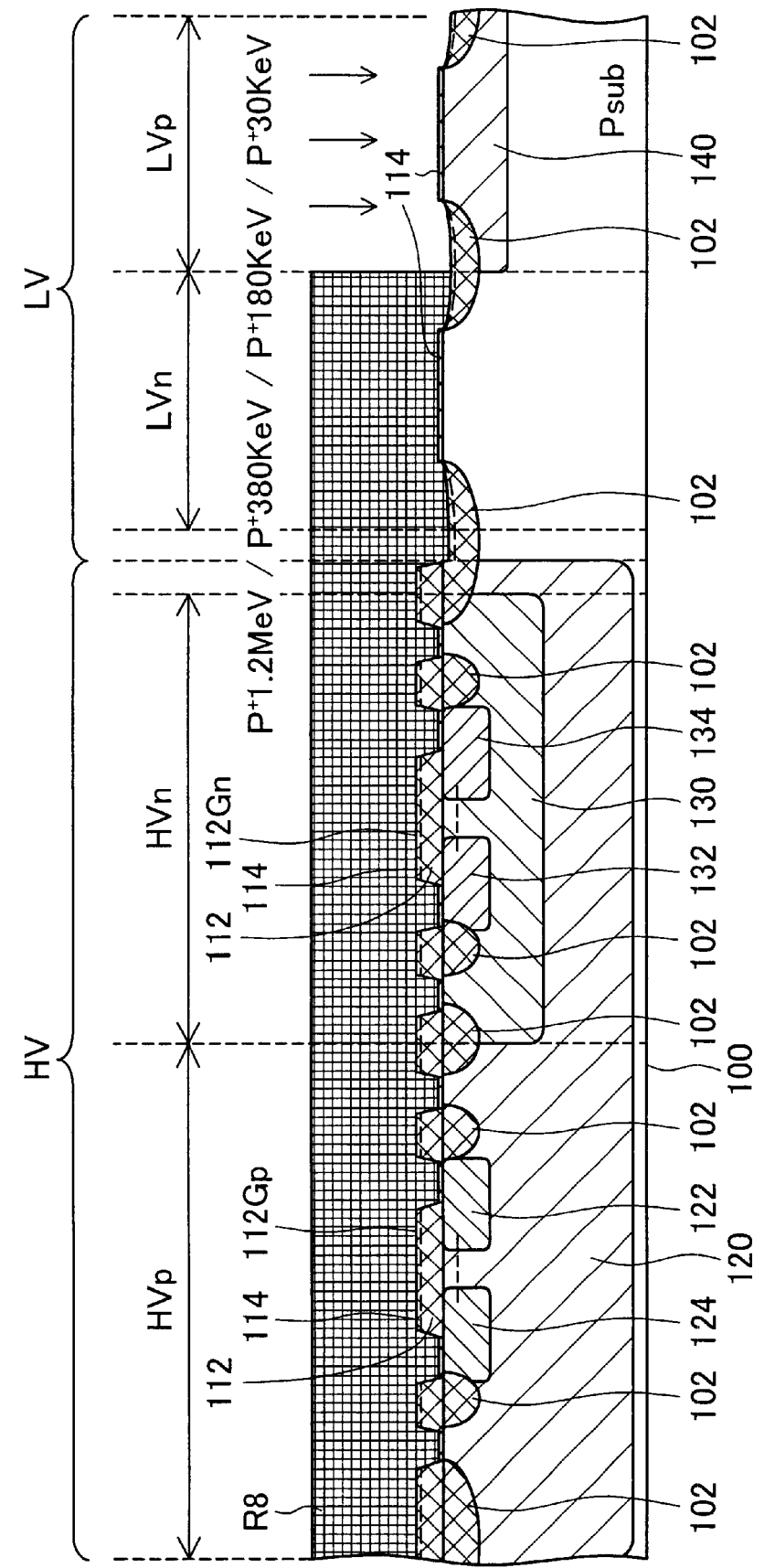
FIG. 13 is a sectional view schematically illustrating a process of forming an n well in a low-breakdown-voltage pMOS area LVp.

The procedure subsequently forms an n well for formation of the low-breakdown-voltage pMOS in the low-breakdown-voltage pMOS area LVp of the low-breakdown-voltage transistor area LV. FIG. 13 is a sectional view schematically illustrating a process of forming an n well in the low-breakdown-voltage pMOS area LVp.

Referring to FIG. 13, the procedure forms a third oxide film 114 by thermal oxidation as a sacrificial oxide film over the whole surface of the substrate 100, and forms an eighth resist R8 on a remaining area other than the low-breakdown-voltage pMOS area LVp. The procedure subsequently implants an n-type impurity ion into the opening of the eighth resist R8, that is, into the substrate 100 in the low-breakdown-voltage pMOS area LVp to form an n well 140. In this example, phosphorus ion ($P^+$) having four different energy levels of 1.2 MeV, 380 keV, 180 keV, and 30 keV is implanted to form the n well 140. The eighth resist R8 is removed after the ion implantation.

Figure 14:
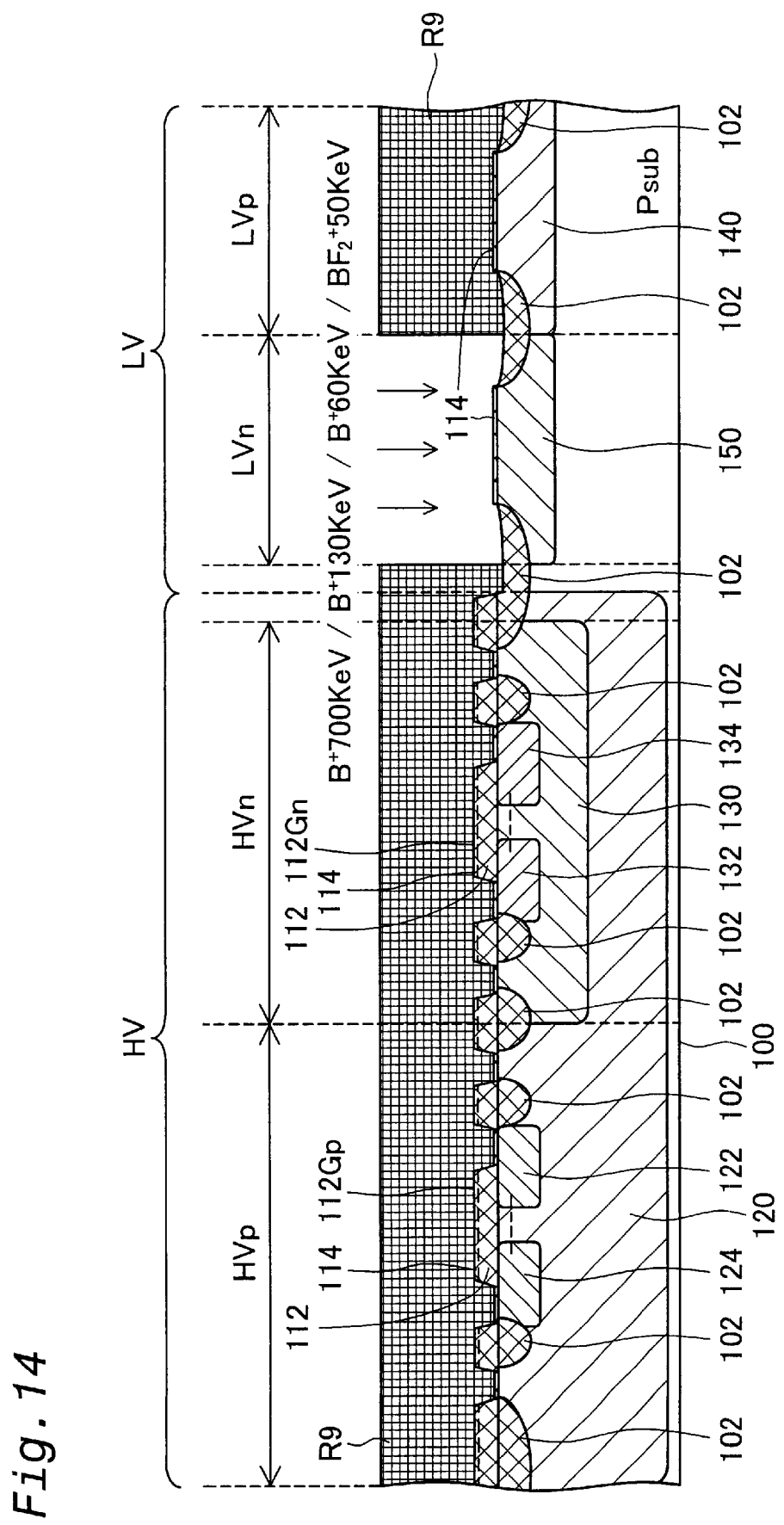
FIG. 14 is a sectional view schematically illustrating a process of forming a p well in a low-breakdown-voltage nMOS area LVn.

The procedure forms a p well for formation of the low-breakdown-voltage nMOS in the low-breakdown-voltage nMOS area LVn of the low-breakdown-voltage transistor area LV. FIG. 14 is a sectional view schematically illustrating a process of forming a p well in the low-breakdown-voltage nMOS area LVn.

Referring to FIG. 14, the procedure forms a ninth resist R9 on a remaining area other than the low-breakdown-voltage nMOS area LVn, and implants a p-type impurity ion into the opening of the ninth resist R9, that is, into the substrate 100 in the low-breakdown-voltage nMOS area LVn to form a p well 150. In this example, boron ion ($B^+$) having three different energy levels of 700 keV, 130 keV, and 60 keV and boron fluoride ion ($BF_2^+$) having an energy level of 50 keV are implanted to form the p well 150. The ninth resist R9 is removed after the ion implantation.

The process of forming the n well 140 shown in FIG. 13 and the process of forming the p well 150 shown in FIG. 14 may be carried out in the reverse order.

At the time of terminating the processes of FIGS. 13 and 14, the gate oxide film 112Gn of the high-breakdown-voltage nMOS and the gate oxide film 112Gp of the high-breakdown-voltage pMOS are composed of the second and the third oxide films 112 and 114. In this example, the third oxide film 114 is formed by thermal oxidation to have a thickness of approximately 100 angstrom. The gate oxide film 112Gn of the high-breakdown-voltage nMOS and the gate oxide film 112Gp of the high-breakdown-voltage pMOS are formed in a thickness of approximately 760 to 770 angstrom.

Figure 15:
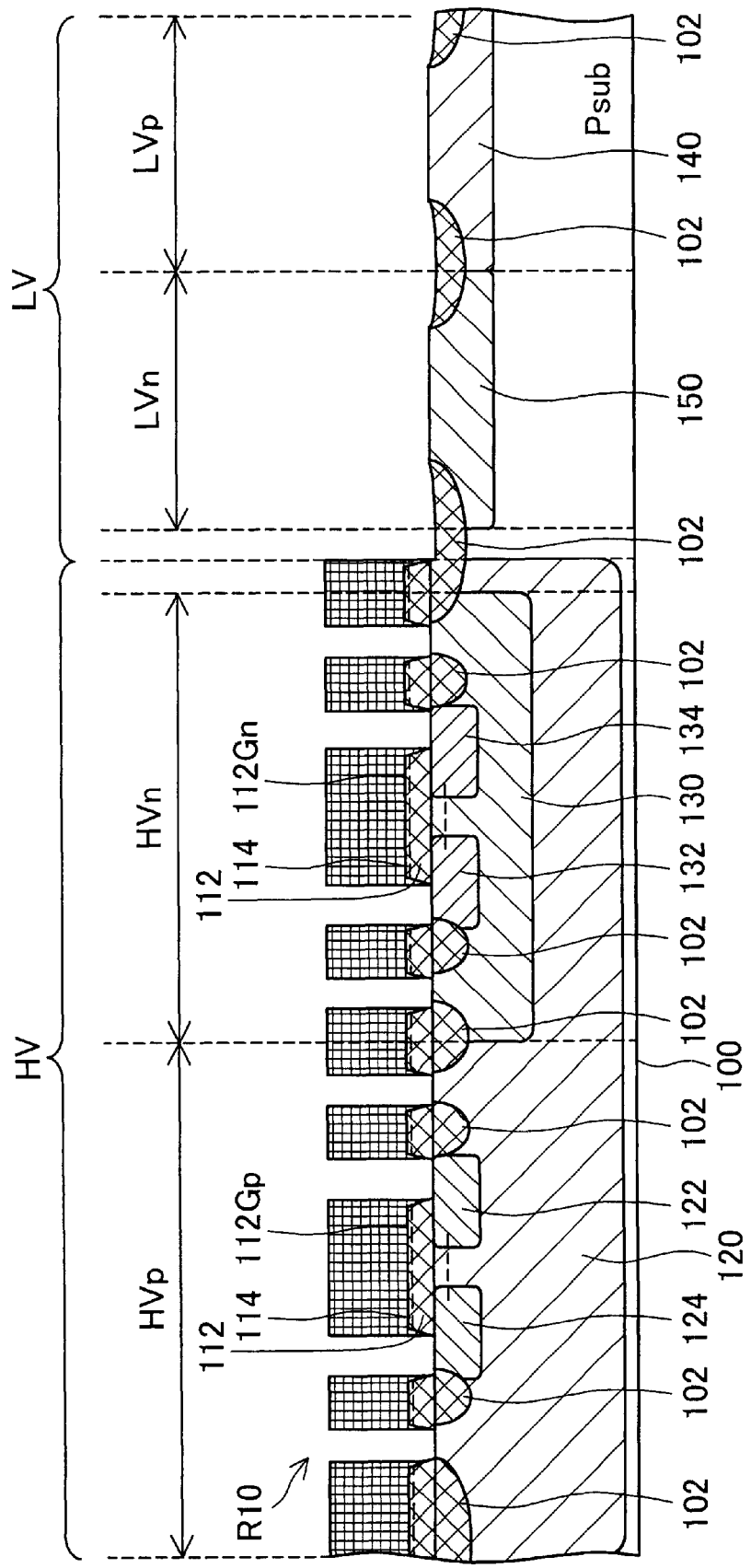
FIG. 15 is a sectional view schematically illustrating a process of forming a gate oxide film of a low-breakdown-voltage transistor.
Figure 16:
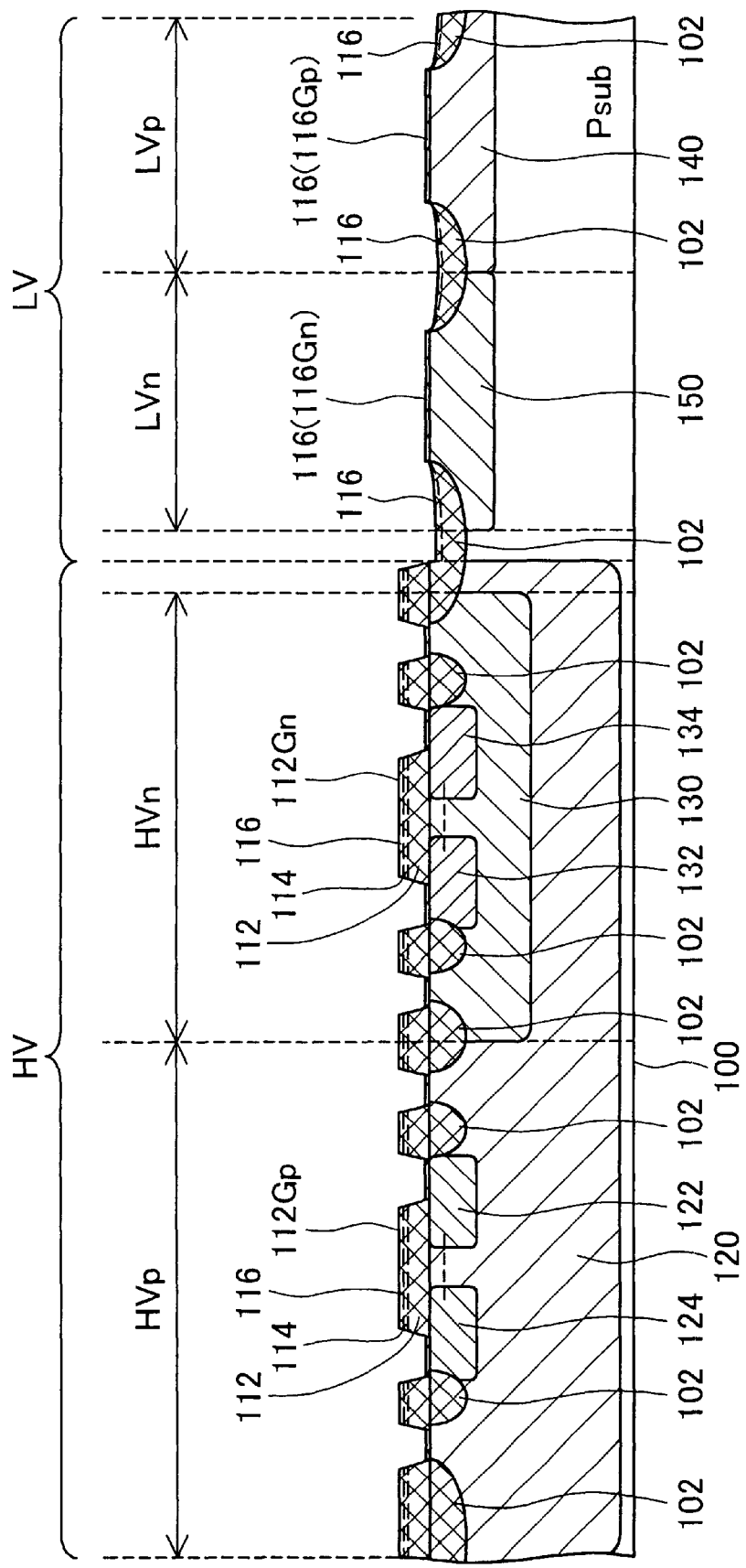
FIG. 16 is a sectional view schematically illustrating the process of forming the gate oxide film of the low-breakdown-voltage transistor.

The procedure subsequently forms a gate oxide film of the low-breakdown-voltage transistor. FIGS. 15 and 16 are sectional views schematically illustrating a process of forming a gate oxide film of the low-breakdown-voltage transistor.

As shown in FIG. 15, the procedure forms a tenth resist RIO and etches off non-required portions of the third oxide film 114. The procedure subsequently removes the tenth resist RIO and makes a fourth oxide film 116 deposit over the whole surface of the substrate 100 as shown in FIG. 16. The fourth oxide film 116 formed on the element forming regions (that is, specific areas interposed between the LOCOS-film parts 102) in the low-breakdown-voltage nMOS area LVn and the low-breakdown-voltage pMOS area LVp gives gate oxide films 116Gn and 116Gp of the low-breakdown-voltage transistor.

The gate oxide film 112Gn of the high-breakdown-voltage nMOS and the gate oxide film 112Gp of the high-breakdown-voltage pMOS are composed of the second through the fourth oxide films 112, 114, and 116. In this example, the fourth oxide film 116 is made to deposit in a thickness of approximately 70 angstrom. The gate oxide film 112Gn of the high-breakdown-voltage nMOS and the gate oxide film 112Gp of the high-breakdown-voltage pMOS are formed in a thickness of approximately 800 angstrom.

Figure 17:
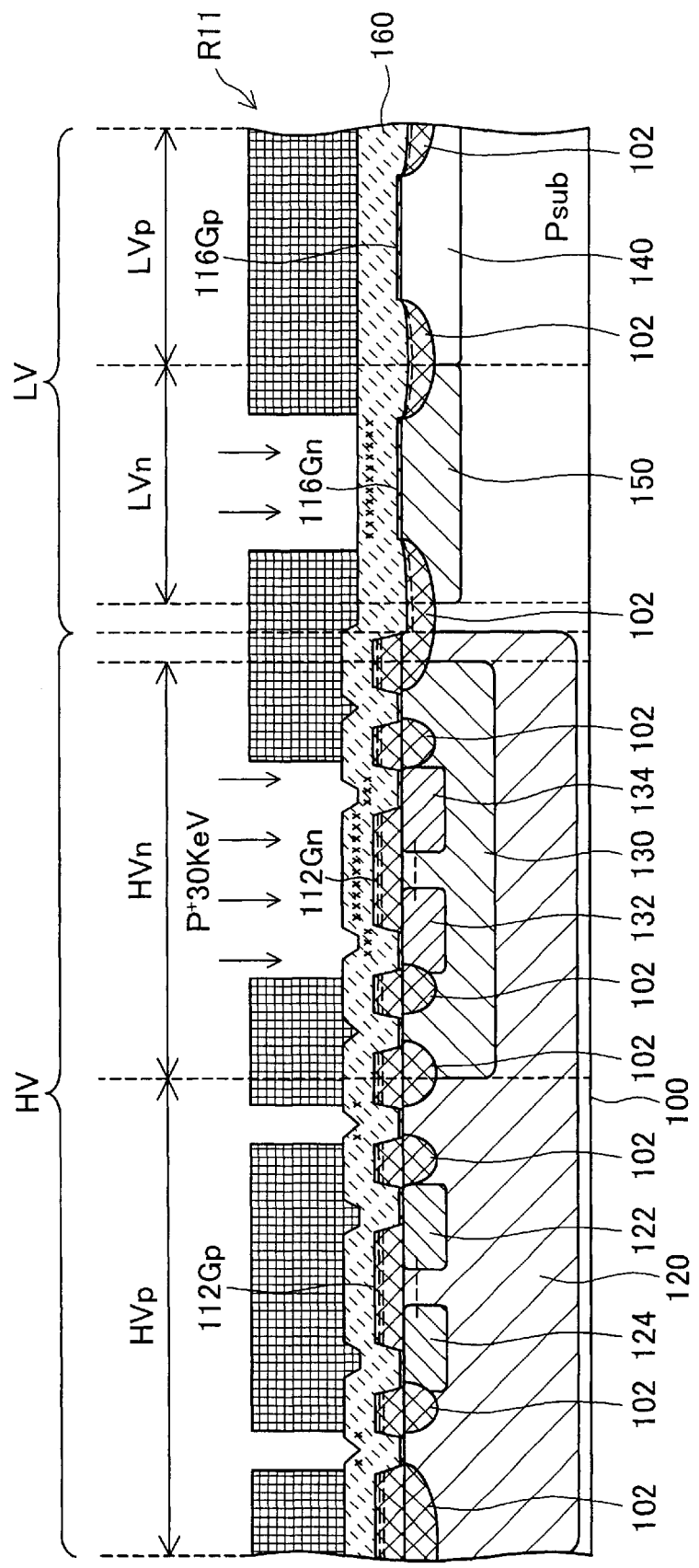
FIG. 17 is a sectional view schematically illustrating a process of forming gate electrodes of the high-breakdown-voltage transistor and the low-breakdown-voltage transistor.
Figure 18:
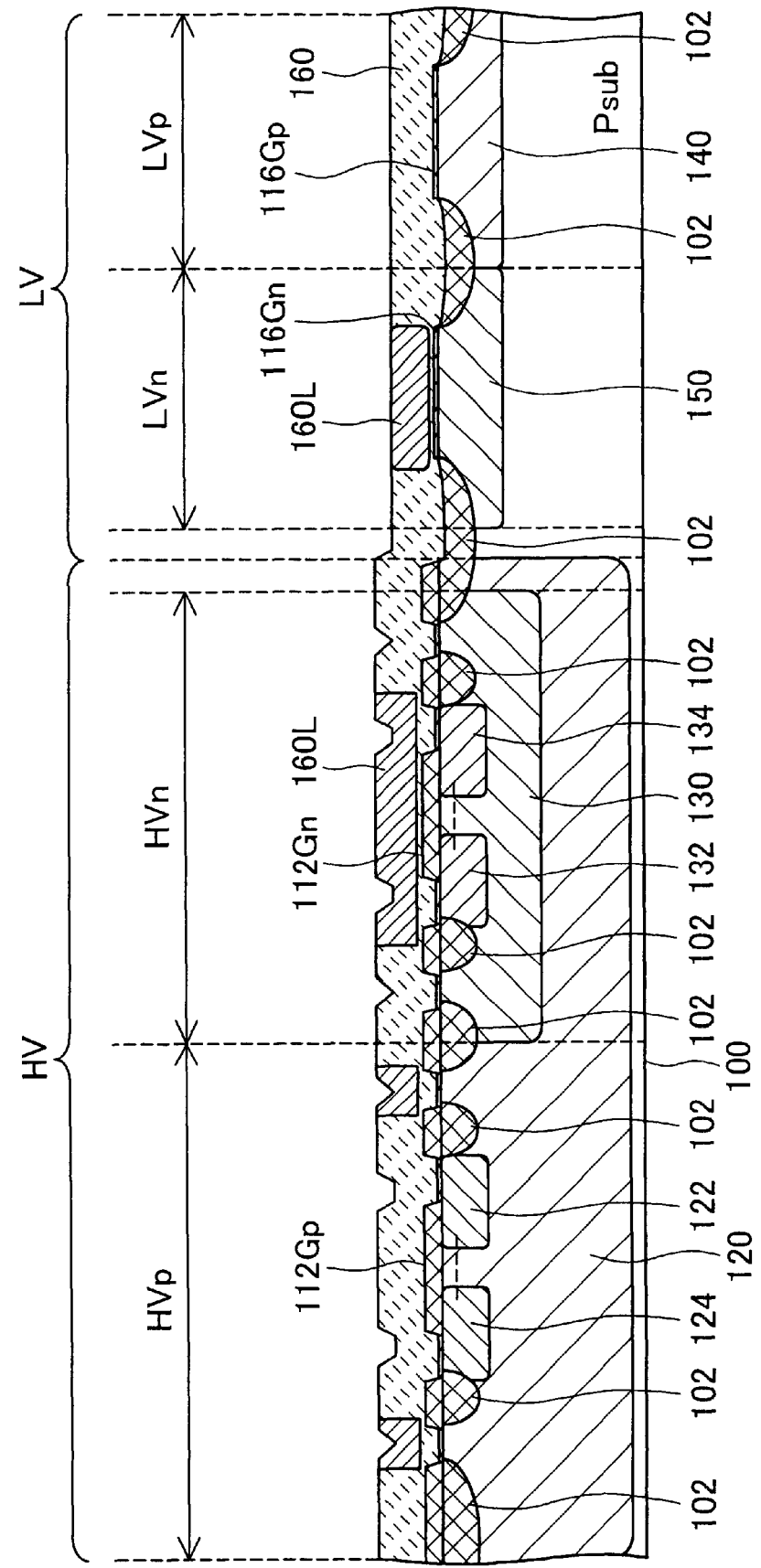
FIG. 18 is a sectional view schematically illustrating the process of forming the gate electrodes of the high-breakdown-voltage transistor and the low-breakdown-voltage transistor.
Figure 19:
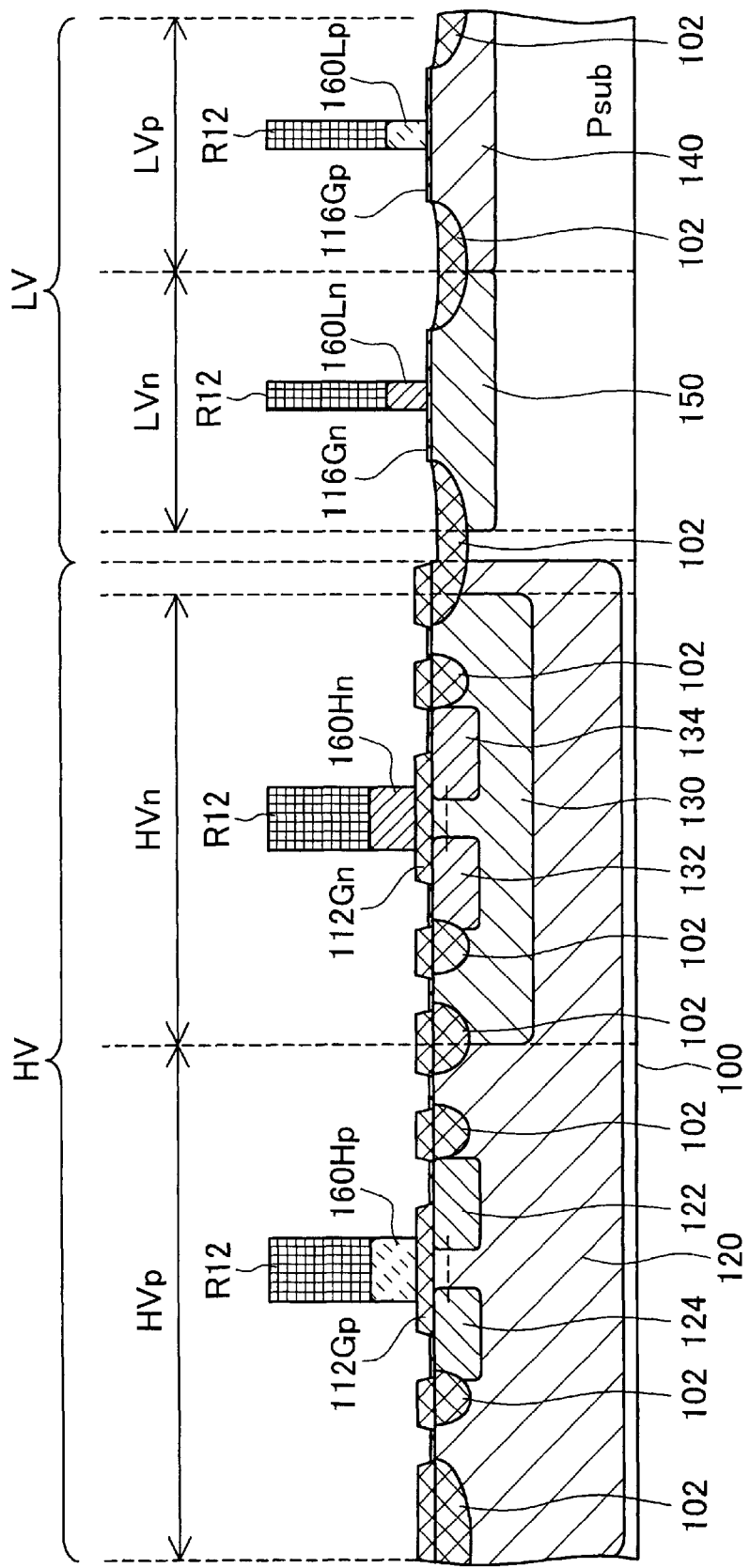
FIG. 19 is a sectional view schematically illustrating the process of forming the gate electrodes of the high-breakdown-voltage transistor and the low-breakdown-voltage transistor.

The procedure subsequently forms gate electrodes of the high-breakdown-voltage transistor and the low-breakdown-voltage transistor. FIGS. 17 through 19 are sectional views schematically illustrating a process of forming gate electrodes of the high-breakdown-voltage transistor and the low-breakdown-voltage transistor.

Referring to FIG. 17, the procedure makes a polysilicon (polySi) film 160 for gate electrodes deposit over the whole surface of the substrate 100, and forms an eleventh resist R11 on a remaining area other than gate electrode-forming areas of the high-breakdown-voltage nMOS and the low-breakdown-voltage nMOS. The procedure subsequently implants an n-type impurity ion into the opening of the eleventh resist R11, that is, into the polySi film 160 in the gate electrode-forming areas of the high-breakdown-voltage nMOS and the low-breakdown-voltage nMOS. In this example, phosphorus ion (P$^+$) having an energy level of 30 keV is implanted. The procedure then removes the eleventh resist R11 and carries out heat treatment to diffuse the implanted n-type impurity ion (phosphorus) as shown in FIG. 18.

The procedure then forms a twelfth resist R12 on the gate electrode-forming areas of the respective transistors as shown in FIG. 19, and etches off non-required portions of the polySi film 160, which are not protected by the twelfth resist R12. This gives a gate electrode 160Hp of the high-breakdown-voltage pMOS, a gate electrode 160Hn of the high-breakdown-voltage nMOS, a gate electrode 160Lp of the low-breakdown-voltage pMOS, and a gate electrode 160Ln of the low-breakdown-voltage nMOS.

The resistance of the polySi material is higher than those of general metal materials applicable for the electrodes. In the case where the polySi material is applied for the gate electrodes, impurity ions adequate for the respective channels should be implanted to lower the resistance. In a process of FIG. 24 discussed later, an n-type impurity ion is implanted into drain and source areas of the nMOS as well as into corresponding gate electrodes. The quantity of ion implantation in this process alone is, however, not sufficient for the gate electrodes of the nMOS and can not sufficiently lower the resistance. The process shown in FIGS. 17 and 18 thus preliminarily lowers the resistance of polySi areas 160H and 160L corresponding to the gate electrodes of the nMOS.

The eleventh resist R11 shown in FIG. 17 has the openings not only in the portions corresponding to the gate electrode-forming areas but in portions corresponding to non-gate electrode-forming areas. This is because the resist R11 is formed with the same resist mask as the resist mask used for formation of a fifteenth resist R15 in the process of ion implantation into drain and source areas shown in FIG. 24 discussed below. Such openings of the eleventh resist R11 in the non-gate electrode-forming areas, however, do not cause any problems, since the polySi film in the non-gate electrode-forming areas is etched off as shown in FIG. 19. An exclusive mask may alternatively be used not to make the openings of the eleventh resist R11 in the non-gate electrode-forming areas.

Figure 20:
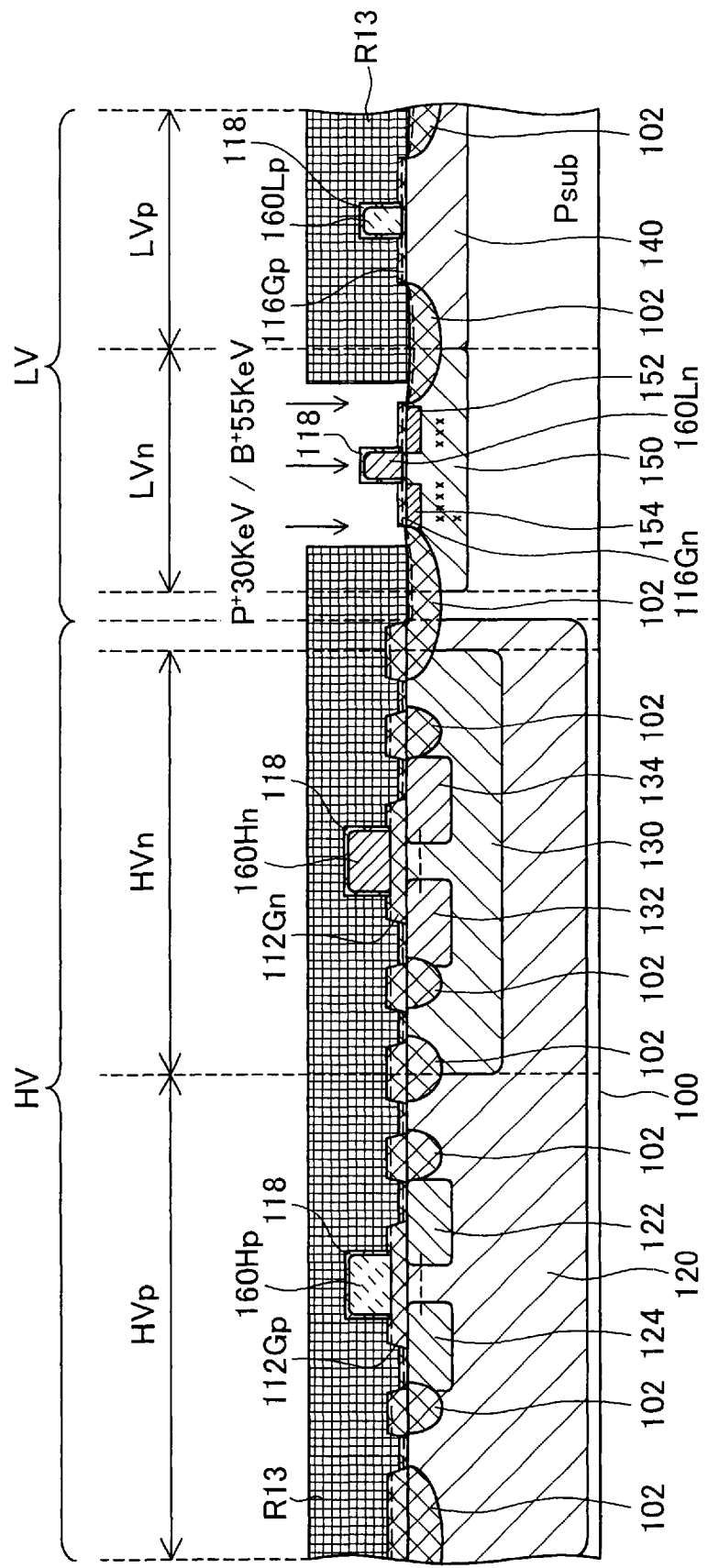
FIG. 20 is a sectional view schematically illustrating a process of forming source and drain offset areas of the low-breakdown-voltage nMOS.

The procedure then forms source and drain offset areas of the low-breakdown-voltage nMOS on the substrate surface side of the p well 150. FIG. 20 is a sectional view schematically illustrating a process of forming source and drain offset areas of the low-breakdown-voltage nMOS.

As shown in FIG. 20, the procedure forms a fifth oxide film 118 over the whole surface of the substrate 100 by thermal oxidation. The procedure then forms a thirteenth resist R13 on a remaining area other than the low-breakdown-voltage nMOS area LVn and implants an n-type impurity ion into a shallower portion of the p well 150. In this example, phosphorus ion (P$^+$) having an energy level of 30 keV is implanted as the n-type impurity ion. This makes a drain offset area 152 and a source offset area 154 for defining a drain area and a source area.

The procedure subsequently implants a p-type impurity ion into a deeper portion of the p well 150. In this example, boron ion (B$^+$) having an energy level of 55 keV is implanted as the p-type impurity ion. The concentration of the n-type impurity ion in the deeper portion of the p well 150 is accordingly less than that in the shallower portion of the p well 150. Such arrangement of the p well 150 attains a relatively high level of withstand voltage between electrodes of the low-breakdown-voltage nMOS.

Figure 21:
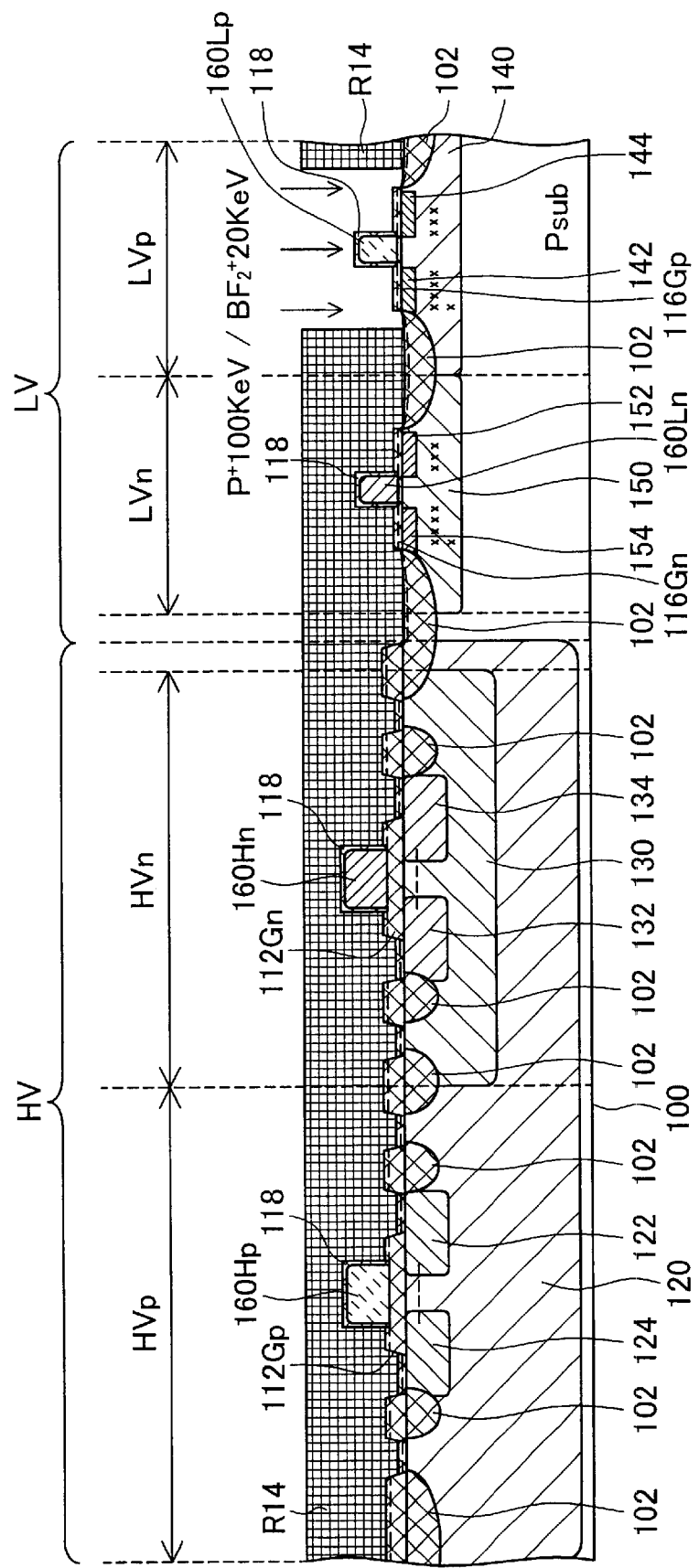
FIG. 21 is a sectional view schematically illustrating a process of forming source and drain offset areas of the low-breakdown-voltage pMOS.

The procedure then forms a source offset area and a drain offset area of the low-breakdown-voltage pMOS on the substrate surface side of the n well 140. FIG. 21 is a sectional view schematically illustrating a process of forming source and drain offset areas of the low-breakdown-voltage pMOS.

As shown in FIG. 21, the procedure forms a fourteenth resist R14 on a remaining area other than the low-breakdown-voltage pMOS area LVp and implants a p-type impurity ion into a shallower portion of the n well 140. In this example, boron fluoride ion (BF$_2^+$) having an energy level of 20 keV is implanted as the p-type impurity ion. This makes a drain offset area 142 and a source offset area 144 for defining a drain area and a source area.

The procedure subsequently implants an n-type impurity ion into a deeper portion of the n well 140. In this example, phosphorus ion (P$^+$) having an energy level of 100 keV is implanted as the n-type impurity ion. The concentration of the p-type impurity ion in the deeper portion of the n well 140 is accordingly less than that in the shallower portion of the n well 140. Such arrangement of the n well 140 attains a relatively high level of withstand voltage between electrodes of the low-breakdown-voltage pMOS.

The process of forming the offset areas of the low-breakdown-voltage nMOS shown in FIG. 20 and the process of forming the offset areas of the low-breakdown-voltage pMOS shown in FIG. 21 may be carried out in the reverse order.

Figure 22:
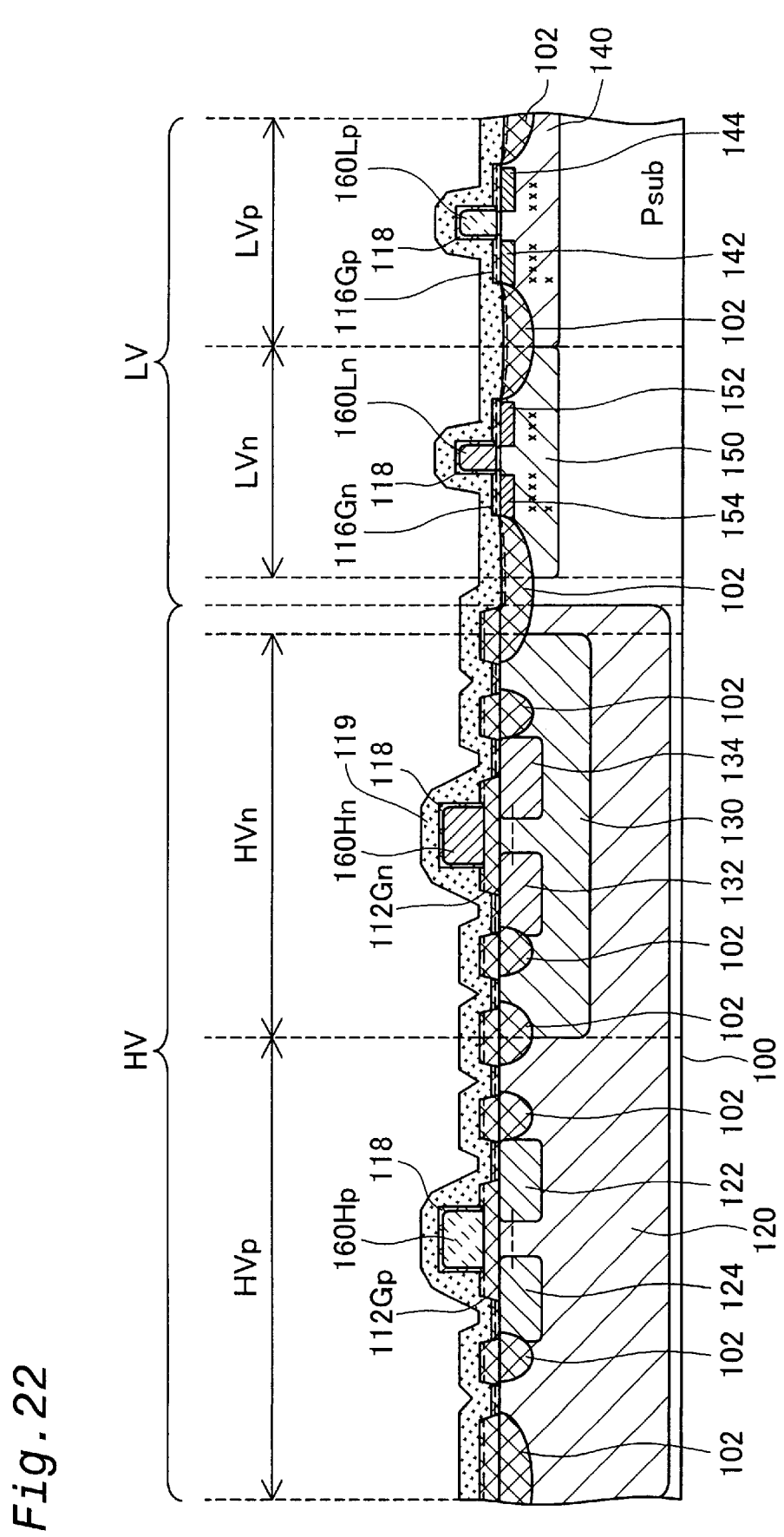
FIG. 22 is a sectional view schematically illustrating a process of forming side walls.
Figure 23:
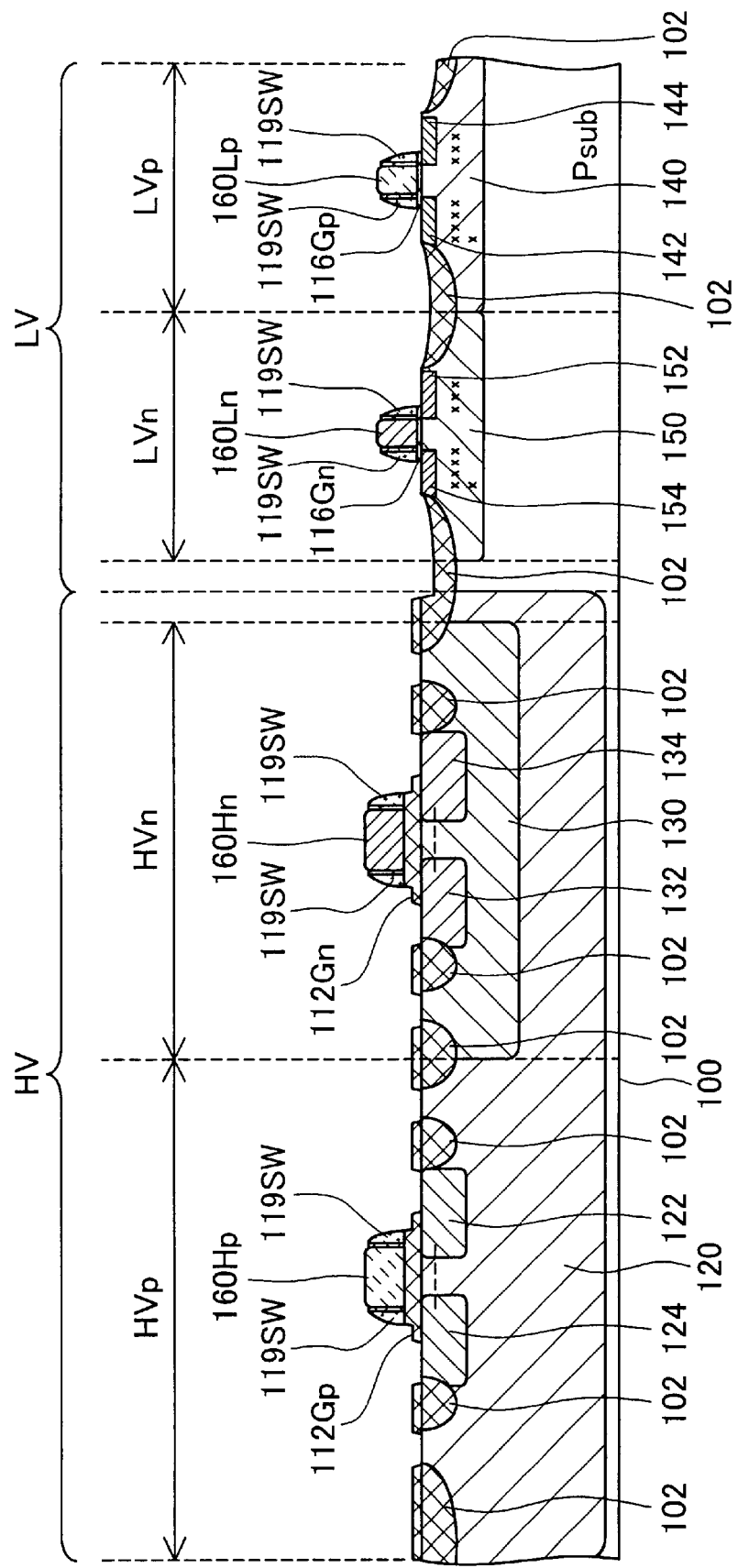
FIG. 23 is a sectional view schematically illustrating the process of forming the side walls.

The procedure subsequently forms side walls on the side faces of the gate electrode 160Ln of the low-breakdown-voltage nMOS and the gate electrode 160Lp of the low-breakdown-voltage pMOS as the mask for formation of the source area and the drain area. FIGS. 22 and 23 are sectional views schematically illustrating a process of forming side walls.

The procedure forms a sixth oxide film 119 for defining side walls over the whole surface of the substrate 100 as shown in FIG. 22. The sixth oxide film 119 in this example has a thickness of approximately 1300 angstrom. The procedure etches back to complete removal of the fifth oxide film 118 and the sixth oxide film 119 covering over the top faces of the gate electrodes 160Hp, 160Hn, 160Lp, and 160Ln of the respective transistors as shown in FIG. 23. Side walls 119SW of the fifth oxide film 118 and the sixth oxide film 119 are accordingly made on the side faces of the gate electrodes 160Lp and 160Ln of the low-breakdown-voltage pMOS and the low-breakdown-voltage nMOS. In a similar manner, the side walls 119SW are also made on the side faces of the gate electrodes 160Hn and 160Hp of the high-breakdown-voltage nMOS and the high-breakdown-voltage pMOS.

Figure 24:
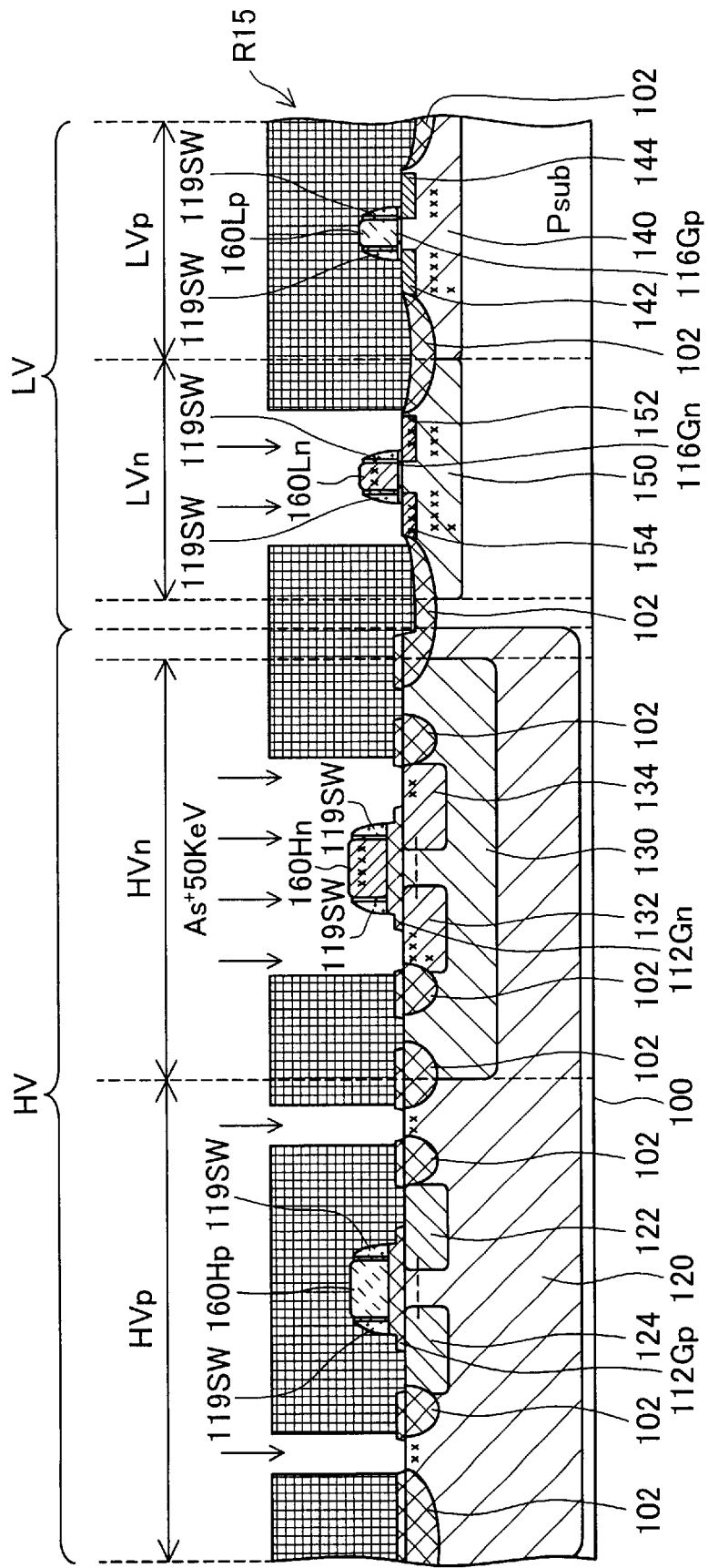
FIG. 24 is a sectional view schematically illustrating a process of specifying drain areas and source areas of the high-breakdown-voltage transistor and the low-breakdown-voltage transistor.
Figure 25:
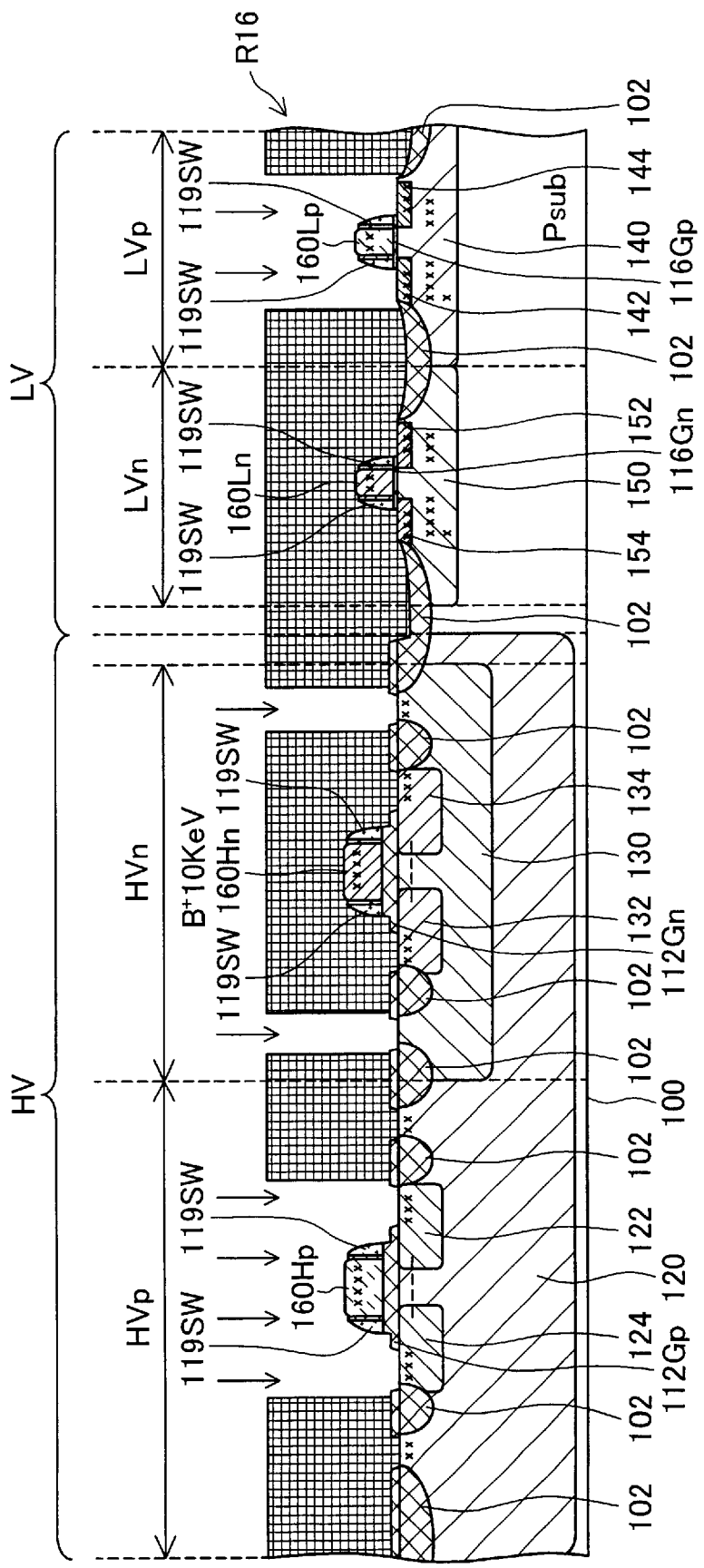
FIG. 25 is a sectional view schematically illustrating the process of specifying the drain areas and the source areas of the high-breakdown-voltage transistor and the low-breakdown-voltage transistor.
Figure 26:
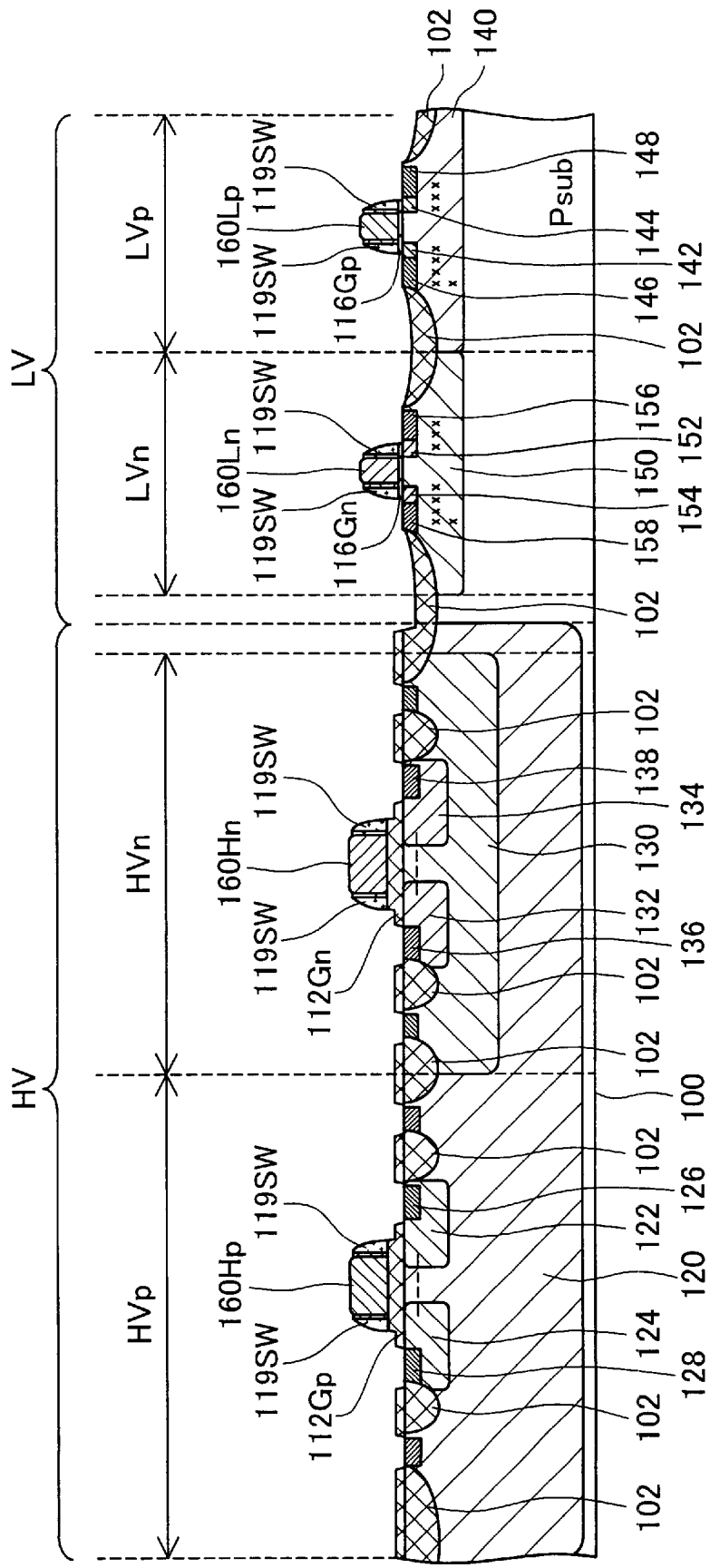
FIG. 26 is a sectional view schematically illustrating the process of specifying the drain areas and the source areas of the high-breakdown-voltage transistor and the low-breakdown-voltage transistor.

The procedure subsequently forms source areas and drain areas of the high-breakdown-voltage transistor and the low-breakdown-voltage transistor. FIGS. 24 through 26 are sectional views schematically illustrating a process of specifying source areas and drain areas of the high-breakdown-voltage transistor and the low-breakdown-voltage transistor.

The procedure first forms a fifteenth resist R15 on a remaining area other than the element forming regions of the high-breakdown-voltage nMOS area HVn and the low-breakdown-voltage nMOS area LVn as shown in FIG. 24. The procedure then implants an n-type impurity ion with the fifteenth resist R15 and the gate oxide film 112Gn in the element forming region of the high-breakdown-voltage nMOS area HVn as the mask or with the fifteenth resist R15, the gate electrode 160Ln, and the side walls 119SW in the element forming region of the low-breakdown-voltage nMOS area LVn as the mask. In this example, arsenic ion (As$^+$) having an energy level of 50 keV is implanted.

The procedure forms a sixteenth resist R16 on a remaining area other than the element forming regions of the high-breakdown-voltage pMOS area HVp and the low-breakdown-voltage pMOS area LVp as shown in FIG. 25. The procedure then implants a p-type impurity ion with the sixteenth resist R16 and the gate oxide film 112Gp in the element forming region of the high-breakdown-voltage pMOS area HVp as the mask or with the sixteenth resist R16, the gate electrode 160Lp, and the side walls 119SW in the element forming region of the low-breakdown-voltage pMOS area LVp as the mask. In this example, boron ion (B$^+$) having an energy level of 10 keV is implanted.

The ion implantation process shown in FIG. 24 and the ion implantation process shown in FIG. 25 may be carried out in the reverse order.

High-temperature heat treatment is carried out for a long time period to diffuse the implanted impurity ions and thereby form a drain area 126 and a source area 128 of the high-breakdown-voltage pMOS, a drain area 136 and a source area 138 of the high-breakdown-voltage nMOS, a drain area 146 and a source area 148 of the low-breakdown-voltage pMOS, and a drain area 156 and a source area 158 of the low-breakdown-voltage nMOS as shown in FIG. 26.

The n-type impurity ion is implanted into the gate electrodes 160Hn and 160Ln of the nMOS, whereas the p-type impurity ion is implanted into the gate electrodes 160Hp and 160Lp of the pMOS as shown in FIGS. 24 and 25. This lowers the resistances of the respective gate electrodes 160Hn, 160Ln, 160Hp, and 160Lp.

The impurity ions are also implanted into specific areas interposed between the LOCOS film-parts 102 other than the nMOS- and pMOS-forming regions in the high-breakdown-voltage transistor area HV as shown in FIGS. 24 and 25. Such implantation prevents insufficient isolation of the elements, due to parasitic generation of channels in the specific areas interposed between the LOCOS film-parts 102.

Figure 27:
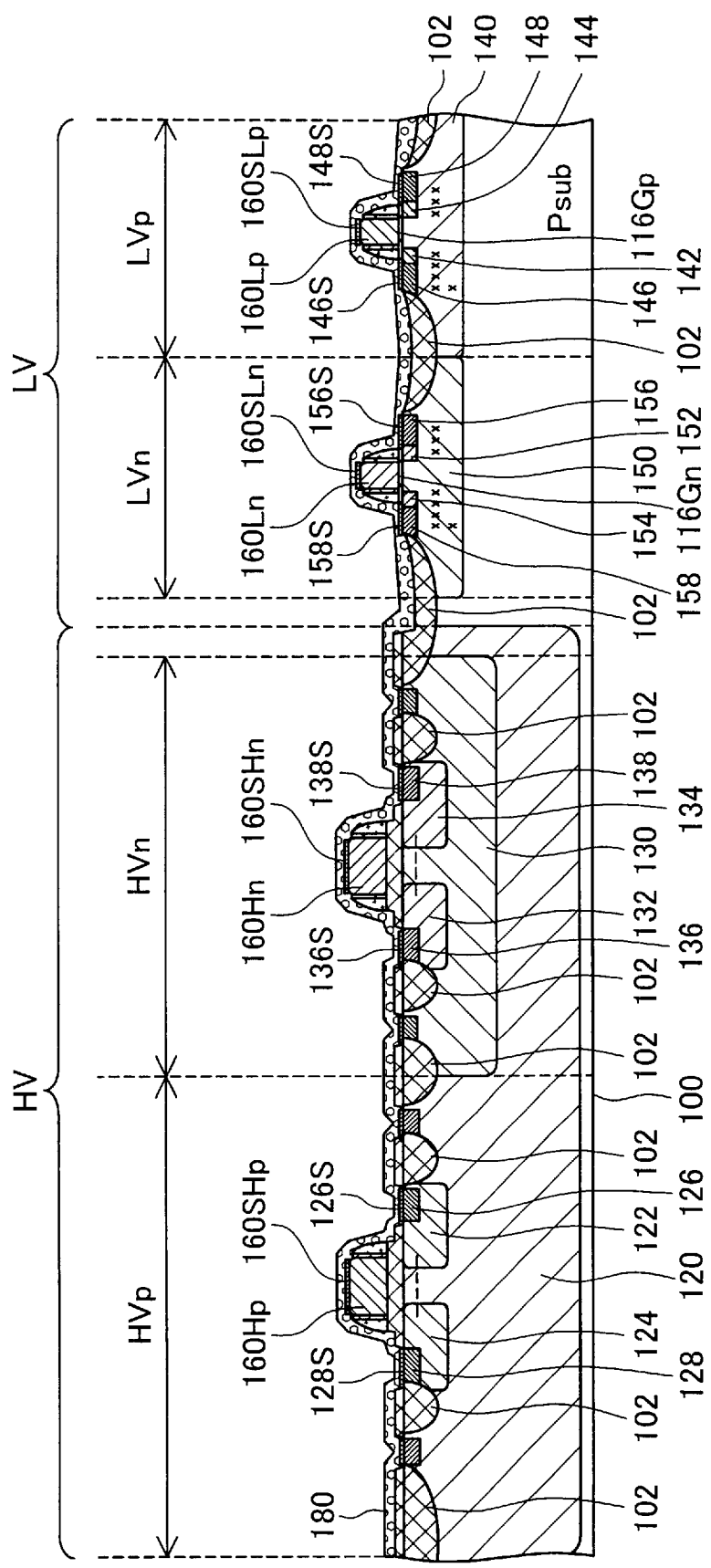
FIG. 27 is a sectional view schematically illustrating a silicidation process.

The procedure subsequently silicidates the surface of the drain, gate, and source areas of the respective transistors. FIGS. 27 and 28 are sectional views schematically illustrating a silicidation process.

A titanium (Ti) film 180 is formed over the whole surface of the substrate 100 by sputtering as shown in FIG. 27. High-temperature heat treatment is carried out for a long time period for silicidation of contact areas 160SHp, 160SHn, 160SLp, 160SLn, 126S, 136S, 146S, 156S, 128S, 138S, 148S, and 158S of the gates 160Hp, 160Hn, 160Lp, and 160Ln, the drains 126, 136, 146, and 156, and the sources 128, 138, 148, and 158 of the respective transistors, which are in contact with the titanium film 180. The non-silicidated titanium film 180 is removed in a self-aligning manner as shown in FIG. 28.

A required series of processes (not shown) including a wiring process are performed after the respective processes shown in FIGS. 1 through 28. This procedure efficiently manufactures a semiconductor device, in which both the high-breakdown-voltage transistor and the low-breakdown-voltage transistor are formed on the identical substrate 100.

Figure 29A:
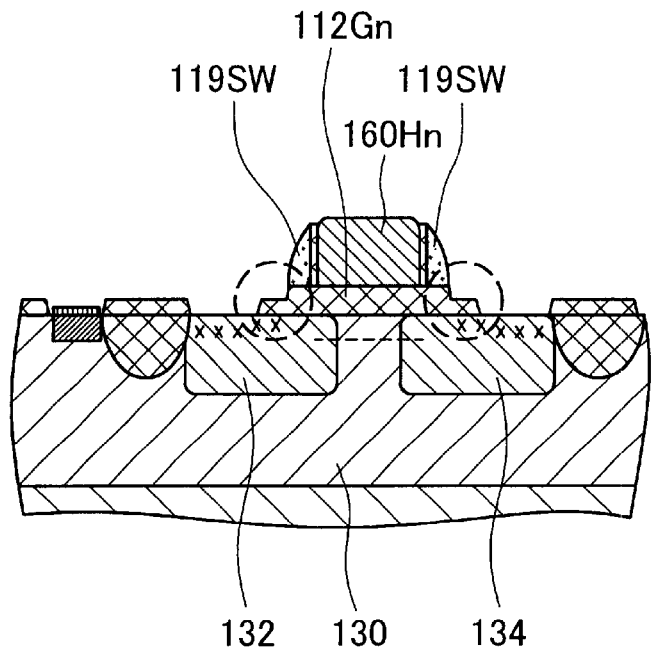
FIGS. 29(A) and 29(B) are sectional views schematically illustrating the structural features of the high-breakdown-voltage nMOS manufactured according to the basic manufacturing method.
Figure 29B:
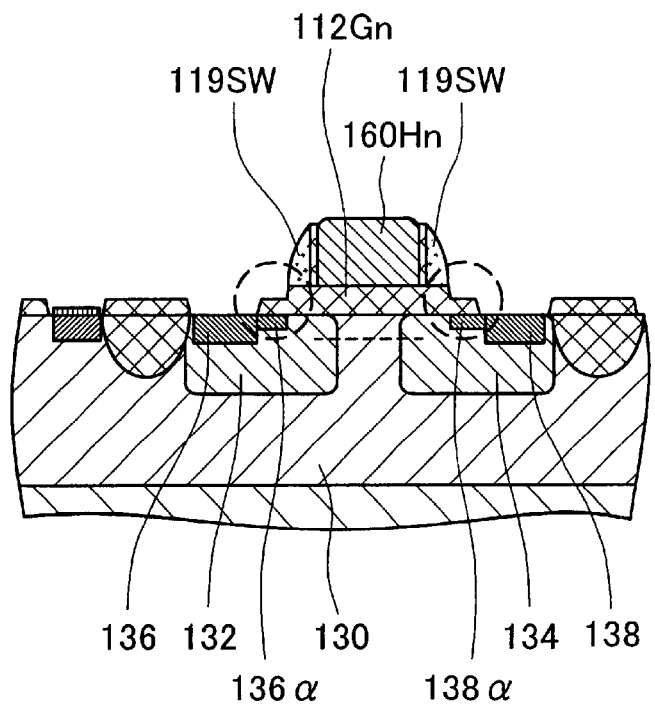
Figure 30:
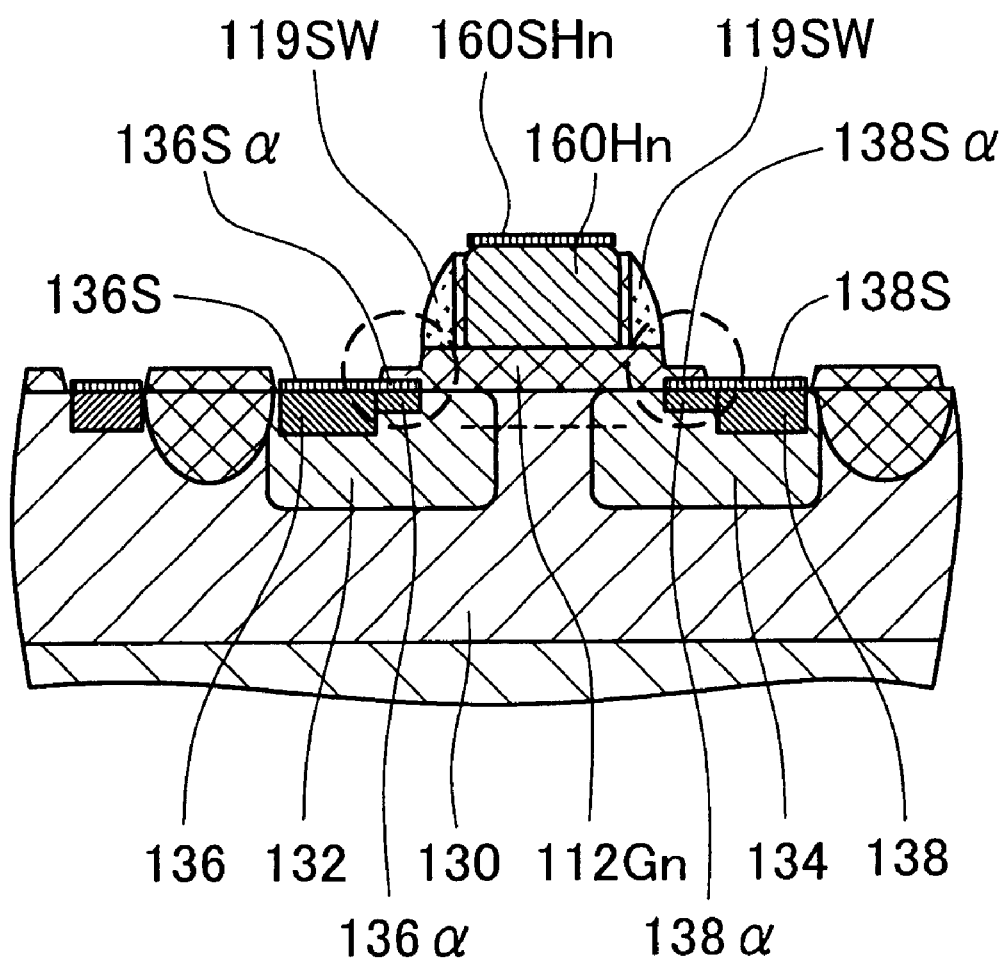
FIG. 30 is a sectional view schematically illustrating the structural features of the high-breakdown-voltage nMOS manufactured according to the basic manufacturing method.

B. Structural Problems of High-breakdown-voltage Transistor Manufactured According to Basic Manufacturing Method FIGS. 29(A), 29(B), and 30 are sectional views schematically illustrating structural features of the high-breakdown-voltage nMOS manufactured according to the basic manufacturing method described above. The structural features of the high-breakdown-voltage pMOS are similar to those of the high-breakdown-voltage nMOS. The following thus describes only the structural features of the high-breakdown-voltage nMOS.

A gate oxide film 112Gn of the high-breakdown-voltage nMOS is over-etched in the process of formation of the side walls 119SW shown in FIGS. 22 and 23. A peripheral portion (a portion encircled by the broken line) of the gate oxide film 112Gn without the side fall 119SW accordingly has the less thickness than the thickness of its center portion as shown in FIG. 29(A). The impurity ion is thus implanted into unexpected areas that are masked with the gate oxide film 112Gn to prohibit implantation of the impurity ion, that is, under-layer offset areas below the peripheral portion (the portion encircled by the broken line) of the gate oxide film 112Gn as shown in FIG. 29(A), in the process of implanting the impurity ion into the offset areas 132 and 134 shown in FIGS. 24 and 25. The heat treatment process shown in FIG. 26 diffuses the implanted impurity ion, so that an additional drain area 136α and an additional source area 138α are formed below the peripheral portion (the portion encircled by the broken line) of the gate oxide film 112Gn as shown in FIG. 29(B). Such formation of the additional drain area 136α and the additional source area 138α narrows the distance between the drain area and the source area and may accordingly lower the level of withstand voltage between the electrodes.

In the silicidation process of FIG. 27, surface regions 136Sα and 138Sα of the under-layer offset areas 136α and 138α below the peripheral portion (the portion encircled by the broken line) of the gate oxide film 112Gn may be silicidated as shown in FIG. 30. Such silicidation also narrows the distance between the drain area and the source area and may accordingly lower the level of withstand voltage between the electrodes. The peripheral portion (the portion encircled by the broken line) of the gate oxide film 112Gn has the less thickness than the thickness of its center portion. The silicidation may thus occur in the thinner peripheral portion even when the under-layer offset areas 136α and 138α below the peripheral portion of the gate oxide film 112Gn are protected from implantation of the impurity and neither additional drain area nor additional source area is formed.

As described above, the gate oxide film of the high-breakdown-voltage transistor manufactured according to the basic manufacturing method is over-etched in the process of forming the side walls on the gate electrode of the low-breakdown-voltage transistor. Such over-etching may lower the level of withstand voltage between the electrodes.

C. Manufacturing Method of Embodiment

In order to solve the drawback of the high-breakdown-voltage transistor manufactured by the basic manufacturing method, the embodiment of the present invention modifies part of the basic manufacturing method as shown in FIGS. 31 through 40. FIGS. 31 through 40 are sectional views schematically illustrating main processes in a method of manufacturing a semiconductor device as one embodiment of the present invention.

Figure 31:
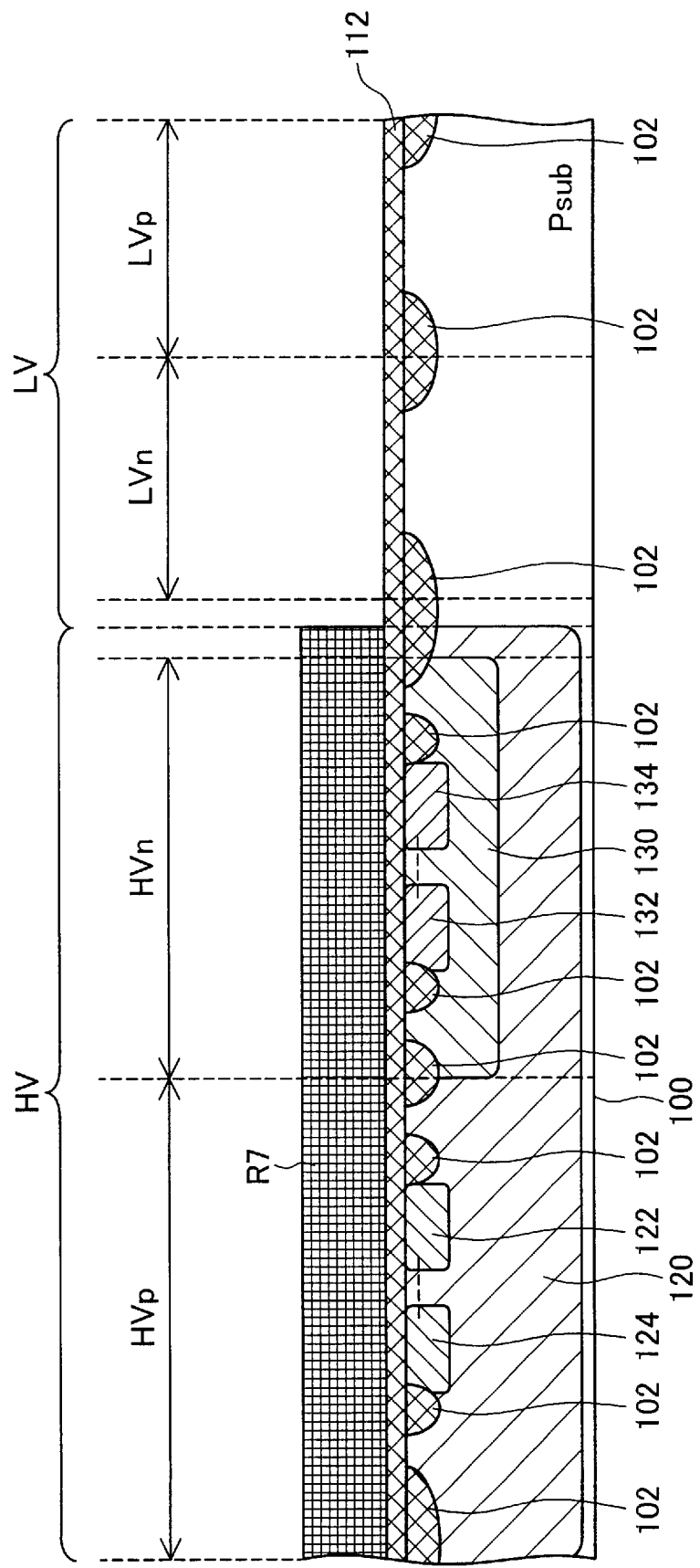
FIG. 31 is a sectional view schematically illustrating a process of forming an oxide film, which is expected to function as a gate oxide film of a high-breakdown-voltage transistor, in a manufacturing method of a semiconductor device in one embodiment of the present invention.
Figure 32:
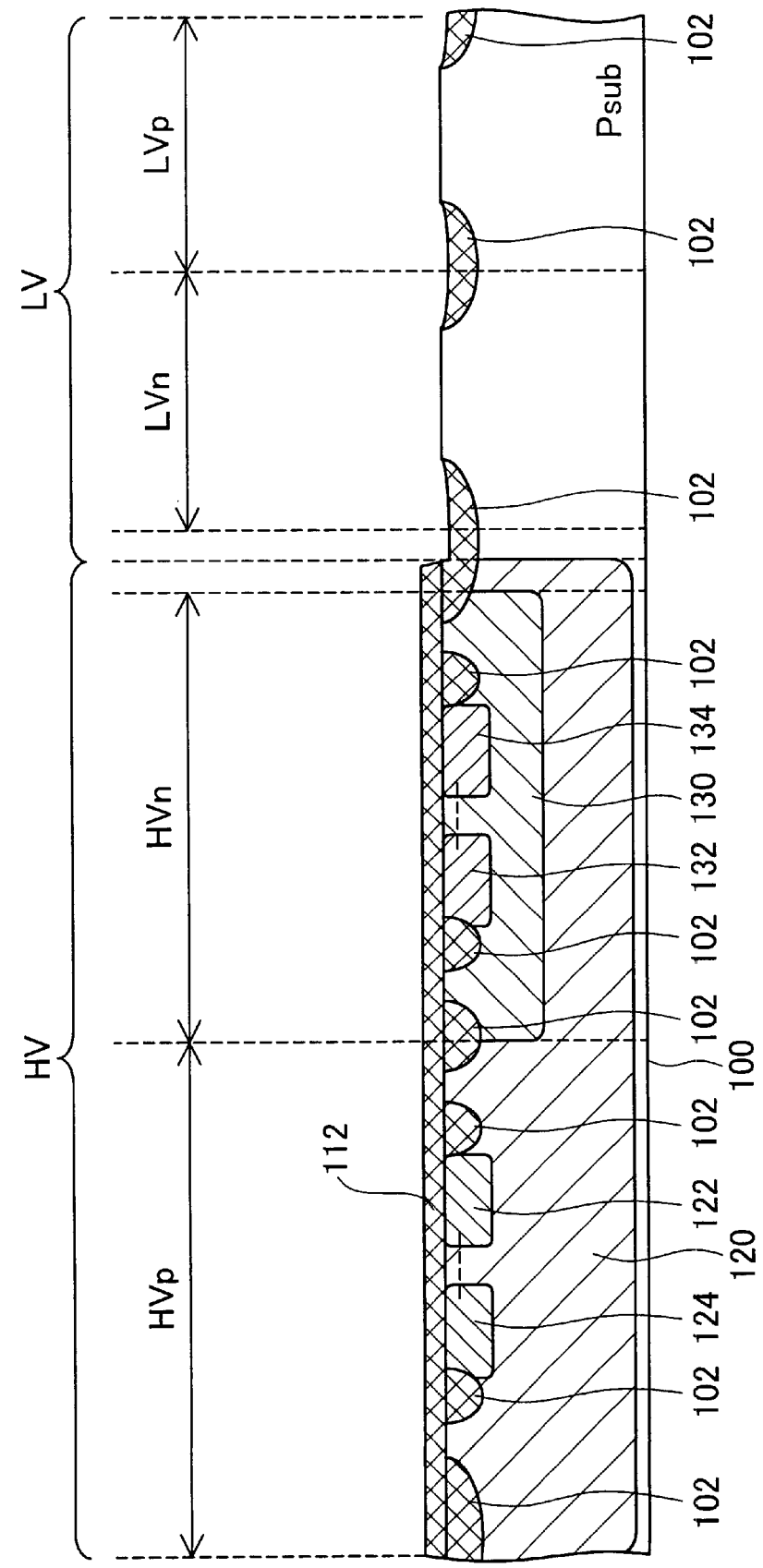
FIG. 32 is a sectional view schematically illustrating the process of forming the oxide film, which is expected to function as the gate oxide film of the high-breakdown-voltage transistor, in the manufacturing method of the embodiment.

The manufacturing method of this embodiment changes the process of forming the gate oxide film of the high-breakdown-voltage transistor in the basic manufacturing method shown in FIGS. 11 and 12 into a process of FIGS. 31 and 32.

FIGS. 31 and 32 are sectional views schematically illustrating a process of forming an oxide film, which is expected to function as a gate oxide film of the high-breakdown-voltage transistor, in the manufacturing method of the embodiment. As clearly understood from comparison between the process of FIGS. 31 and 32 and the process of FIGS. 11 and 12, with regard to the second oxide film 112 formed on the substrate 100, the oxide film in the low-breakdown-voltage transistor area LV is all removed off, while the whole oxide film in the high-breakdown-voltage transistor area HV is left intact without any opening. The resist R7 is thus changed to a resist R7A in the process of FIG. 31.

Referring to FIG. 31, the concrete procedure forms the resist R7A over the whole high-breakdown-voltage transistor area HV in order to protect the oxide film in the high-breakdown-voltage transistor area HV, after thermal oxidation of the second oxide film 112, and etches off only the oxide film 112 in the low-breakdown-voltage transistor area LV. An oxide film, which is expected to function as a gate oxide film, is accordingly formed only in the high-breakdown-voltage transistor area HV as shown in FIG. 32.

The subsequent processes of the manufacturing method in this embodiment up to the process of forming the source and drain offset areas of the low-breakdown-voltage MOS shown in FIGS. 20 and 21 are similar to those in the basic manufacturing method discussed above. In the method of this embodiment, however, the whole surface of the oxide film is left in the high-breakdown-voltage transistor area HV. According to such difference, for example, the shape of the tenth resist R10 formed in the high-breakdown-voltage transistor area HV is changed in the process of forming the gate oxide film of the low-breakdown-voltage transistor shown in FIG. 15.

Figure 33:
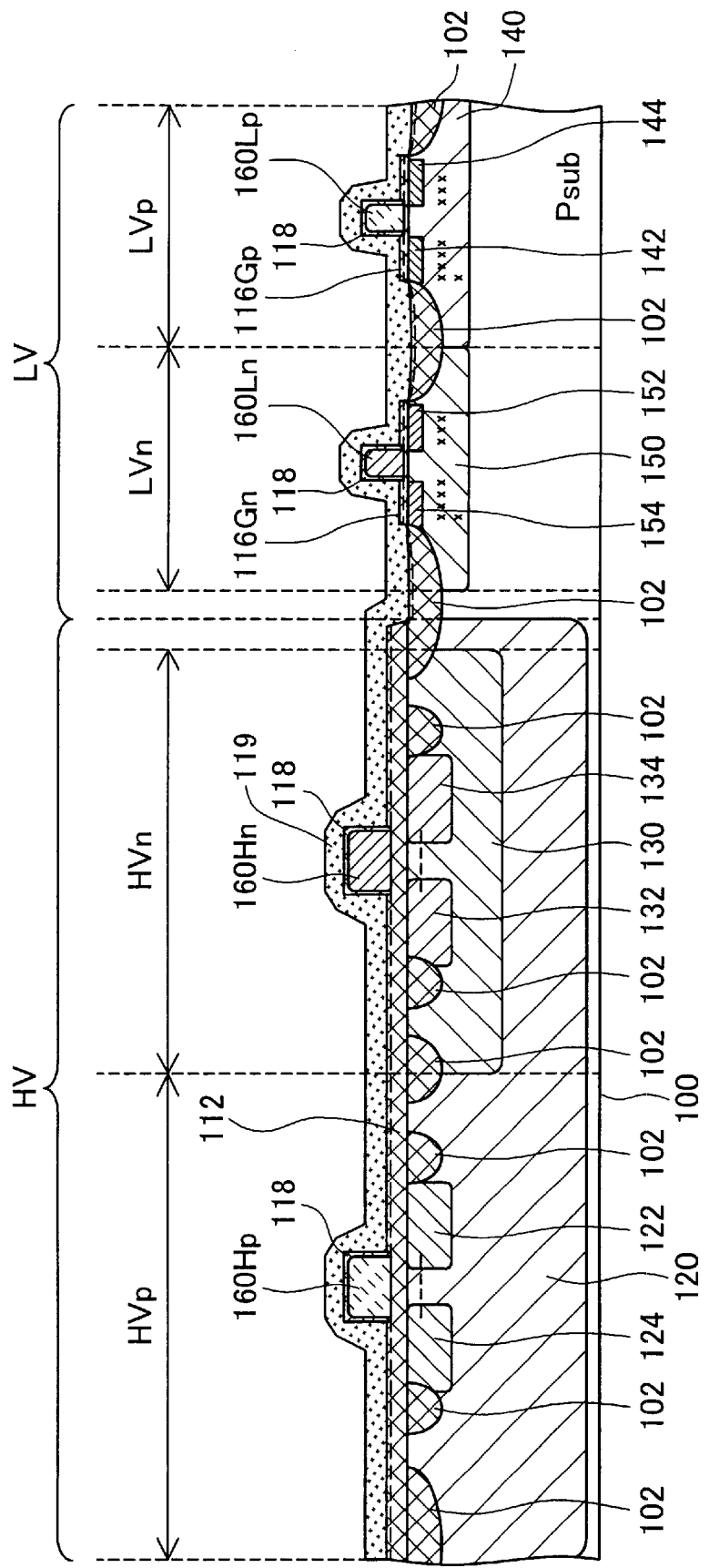
FIG. 33 is a sectional view schematically illustrating a process of forming side walls in the manufacturing method of the embodiment.
Figure 34:
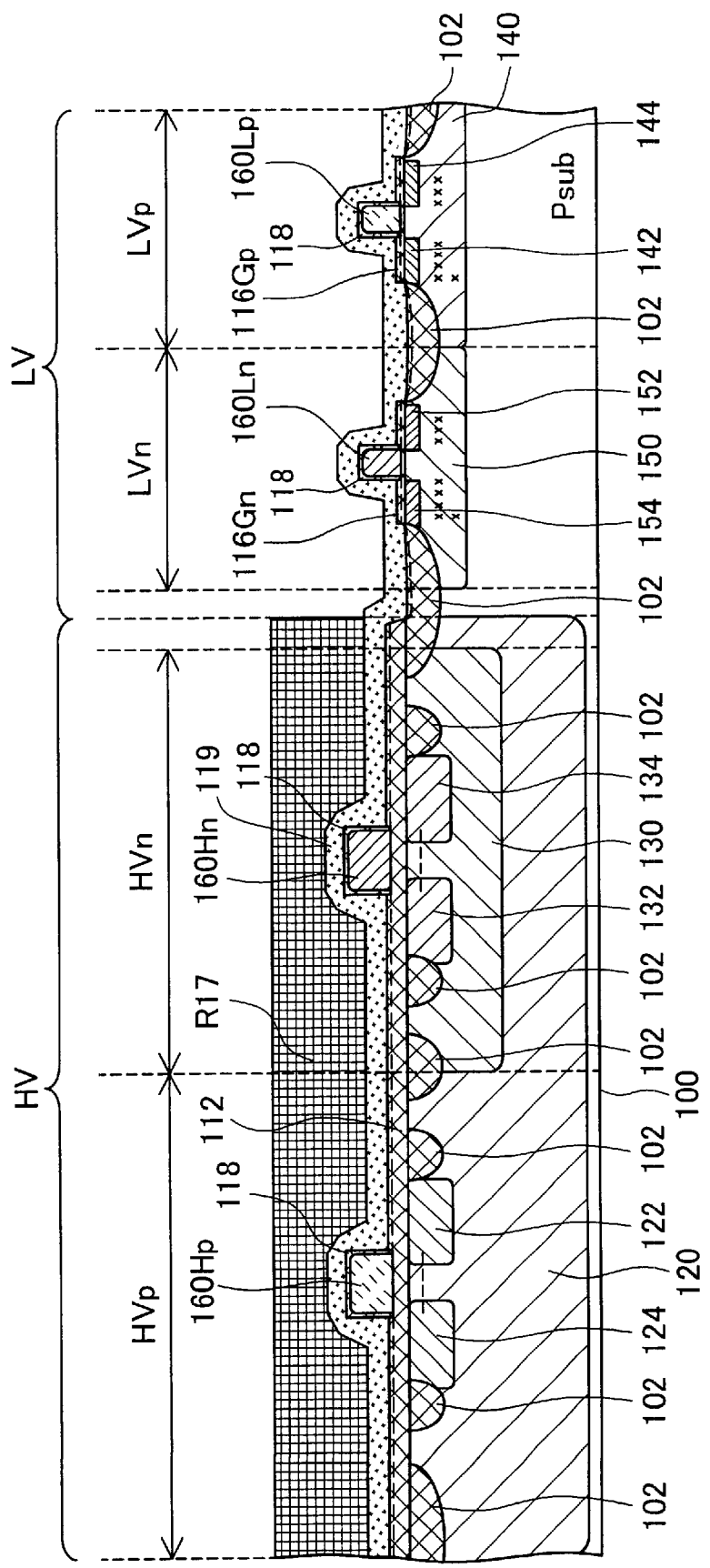
FIG. 34 is a sectional view schematically illustrating the process of forming the side walls in the manufacturing method of the embodiment.
Figure 35:
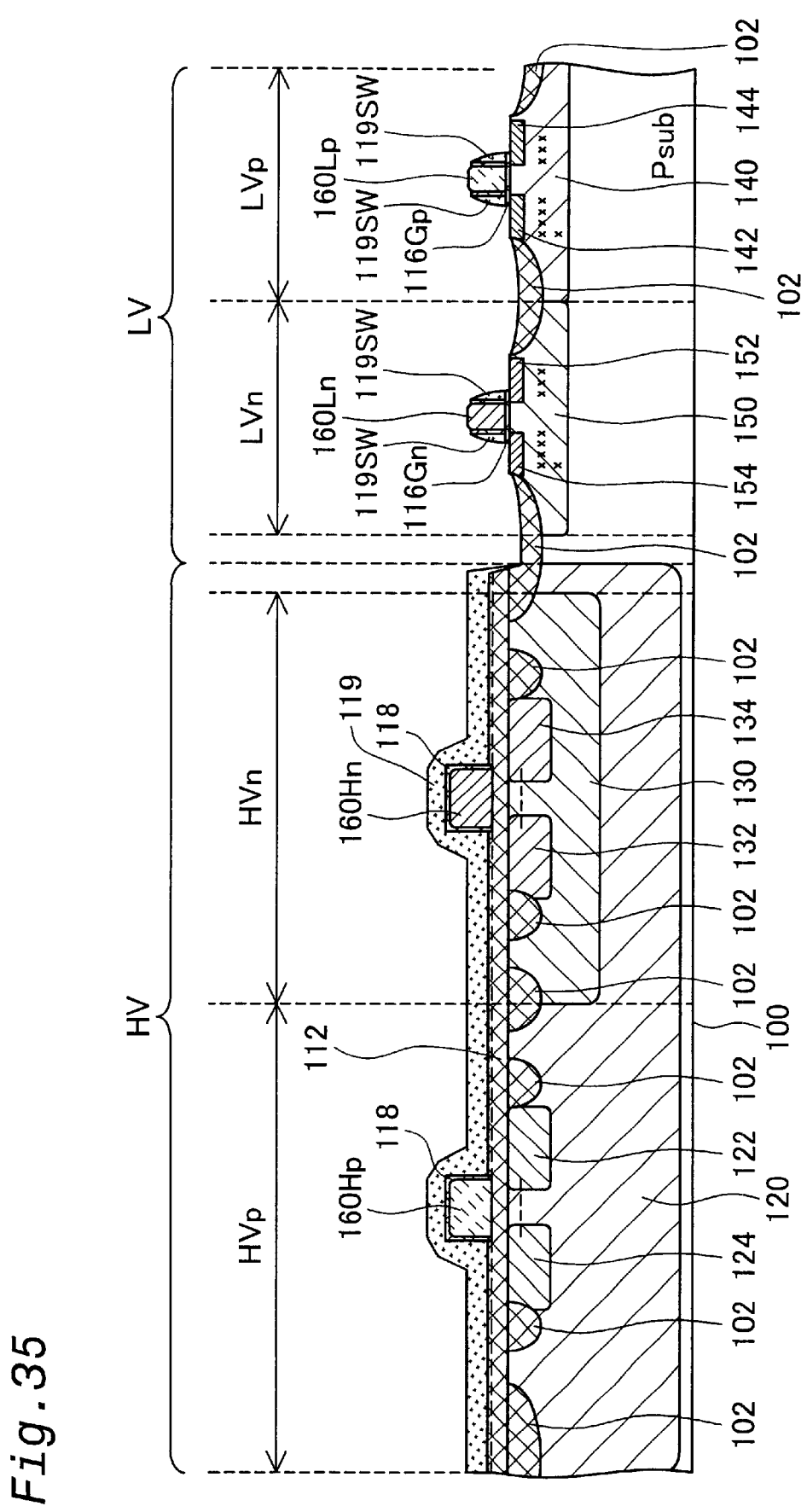
FIG. 35 is a sectional view schematically illustrating the process of forming the side walls in the manufacturing method of the embodiment.

The manufacturing method of this embodiment changes the process of forming the side walls shown in FIGS. 22 and 23 and the process of specifying the drain areas and the source areas of the high-breakdown-voltage transistor and the low-breakdown-voltage transistor shown in FIGS. 24 and 25 in the basic manufacturing method into a process of FIGS. 33 through 35 and a process of FIGS. 36 through 40, respectively.

FIGS. 33 through 35 are sectional views schematically illustrating a process of forming side walls in the manufacturing method of the embodiment. In the basic manufacturing method, the process of FIGS. 22 and 23 forms the sixth oxide film 119 for defining side walls over the whole surface of the substrate 100 and etches the whole face of the sixth oxide film 119, in order to form the side walls 119SW not only on the side faces of the gate electrodes 160Lp and 160Ln in the low-breakdown-voltage transistor area LV but on the side faces of the gate electrodes 160Hn and 160Hp in the high-breakdown-voltage transistor area HV. In the manufacturing method of this embodiment, on the other hand, the process of FIGS. 33 through 35 forms a sixth oxide film 119 for defining side walls over the whole surface of the substrate 100 and etches the sixth oxide film 119 only in the low-breakdown-voltage transistor area LV, in order to form side walls 119SW only on the side faces of the gate electrodes 160Lp and 160Ln in the low-breakdown-voltage transistor area LV.

Referring to FIG. 33, the concrete procedure forms the sixth oxide film 119 for defining the side walls over the whole surface of the substrate 100. In this embodiment, the thickness of the sixth oxide film 119 is approximately 1300 angstrom. As shown in FIG. 34, the procedure then forms a seventeenth resist R17 over the whole face of the high-breakdown-voltage transistor area HV, in order to define the side walls only in the low-breakdown-voltage transistor area LV and leave the oxide film 119 intact in the high-breakdown-voltage transistor area HV. The procedure carries out over-etching of the low-breakdown-voltage transistor area LV to exposure of the substrate 100 as shown in FIG. 35. Side walls 119SW of the fifth oxide film 118 and the sixth oxide film 119 are accordingly formed on the side faces of the gate electrodes 160Lp and 160Ln of the low-breakdown-voltage pMOS and the low-breakdown-voltage nMOS in the low-breakdown-voltage transistor area LV. No side walls 119SW are, however, formed but the fifth oxide film 118 and the sixth oxide film 119 are left intact in the high-breakdown-voltage transistor area HV.

The manufacturing method of this embodiment changes the process of specifying the drain areas and the source areas of the high-breakdown-voltage transistor and the low-breakdown-voltage transistor shown in FIGS. 24 through 26 into a process of FIGS. 36 through 40. The concrete procedure of the embodiment separately carries out implantation of the impurity ion in the high-breakdown-voltage transistor area HV and in the low-breakdown-voltage transistor area LV, while the basic manufacturing method carries out implantation of the impurity ion simultaneously in the high-breakdown-voltage transistor area HV and the low-breakdown-voltage transistor area LV.

Figure 36:
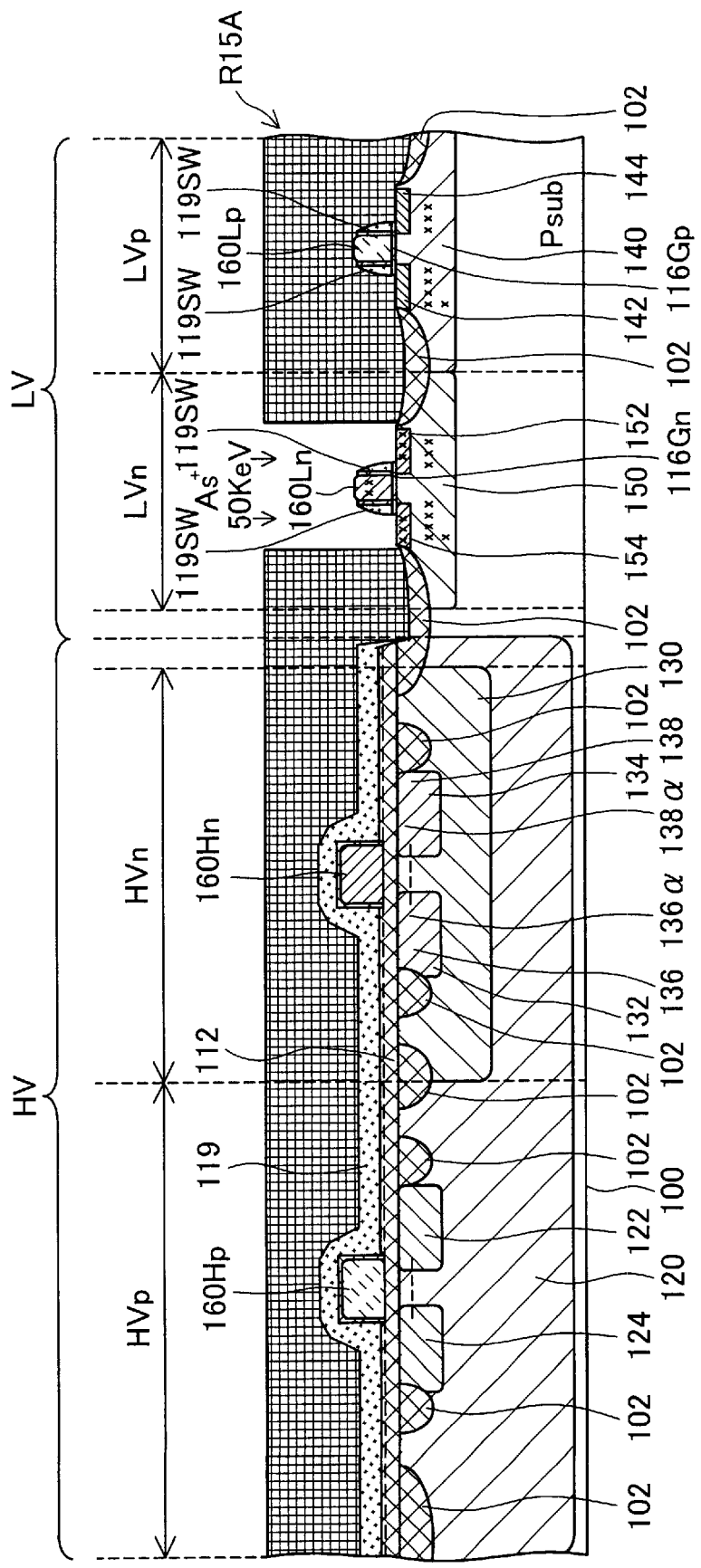
FIG. 36 is a sectional view schematically illustrating a process of specifying a drain area and a source area of a low-breakdown-voltage transistor in the manufacturing method of the embodiment.

FIG. 36 is a sectional view schematically illustrating a process of specifying a drain area and a source area of a low-breakdown-voltage transistor in the manufacturing method of the embodiment. As clearly understood from the comparison with the process of FIG. 24, the fifteenth resist R15 is changed to a resist R15A in the process of FIG. 36. The resist R15A keeps open only the element forming region of the low-breakdown-voltage nMOS area LVn, while covering over the residual area including the element forming region of the high-breakdown-voltage nMOS area HVn. The procedure uses this resist R15A and implants the n-type impurity ion only into the element forming region of the low-breakdown-voltage nMOS area LVn.

Referring to FIG. 36, the concrete procedure forms the resist R15A over the whole area except the element forming region of the low-breakdown-voltage nMOS area LVn, and carries out implantation of the n-type impurity into the element forming region of the low-breakdown-voltage nMOS area LVn with the resist R15A as well as the gate electrode 160Ln and the side walls 119SW as the mask. In this embodiment, arsenic ion ($As^+$) having an energy level of 50 keV is implanted. This causes the n-type impurity ion to be implanted into a drain-source forming region out of the element forming region of the low-breakdown-voltage nMOS area LVn.

Figure 37:
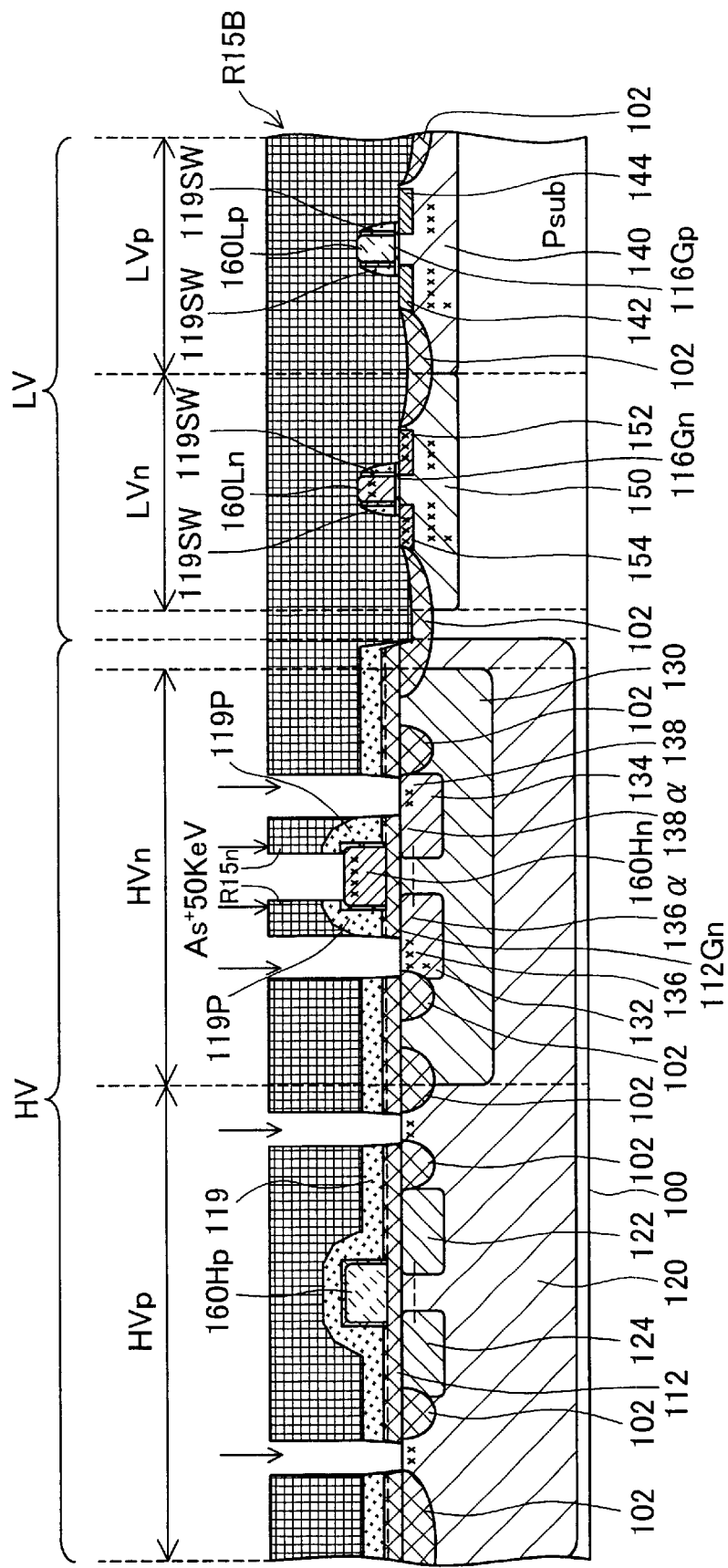
FIG. 37 is a sectional view schematically illustrating a process of specifying a drain area and a source area of a high-breakdown-voltage transistor in the manufacturing method of the embodiment.

FIG. 37 is a sectional view schematically illustrating a process of specifying a drain area and a source area of a high-breakdown-voltage transistor in the manufacturing method of the embodiment. As clearly understood from the comparison with the process of FIG. 24, the fifteenth resist R15 is changed to a resist R15B in the process of FIG. 37. The resist R15B includes a resist R15n, which covers at least the oxide films 119 and 112 in the vicinity of the gate electrode 160Hn of the high-breakdown-voltage nMOS area HVn. The resist R15B also covers the whole surface of the low-breakdown-voltage transistor area LV including the element forming region of the low-breakdown-voltage nMOS area LVn. The procedure of FIG. 37 uses this resist R15B and etches off non-required portions of the sixth oxide film 119 and the second oxide film 112 in the high-breakdown-voltage transistor area HV. This keeps a drain-source forming region and the upper face of the gate electrode 160Hn open in the element forming region of the high-breakdown-voltage nMOS area HVn. The procedure does not remove the resist R15B but continuously uses the same resist R15B, and implants the n-type impurity ion into the open drain-source forming region and gate electrode 160Hn.

Referring to FIG. 37, the concrete procedure forms the resist R15B over the whole area except the element forming region of the high-breakdown-voltage nMOS area HVn, and etches off non-required portions of the sixth oxide film 119 and the second oxide film 112 in the high-breakdown-voltage transistor area HV. This keeps the drain-source forming region and the upper face of the gate electrode 160Hn open in the element forming region of the high-breakdown-voltage nMOS area HVn. A gate oxide film 112Gn is accordingly formed, and a protective oxide film 119 is further formed to cover the gate oxide film 112Gn in the vicinity of the gate electrode 160Hn.

The procedure uses the same resist R15B as the mask and carries out implantation of the n-type impurity ion. In this embodiment, arsenic ion ($As^+$) having an energy level of 50 keV is implanted. This causes the n-type impurity ion to be implanted into at least the drain-source forming region and the gate electrode 160Hn out of the element forming region of the high-breakdown-voltage nMOS area HVn.

Figure 38:
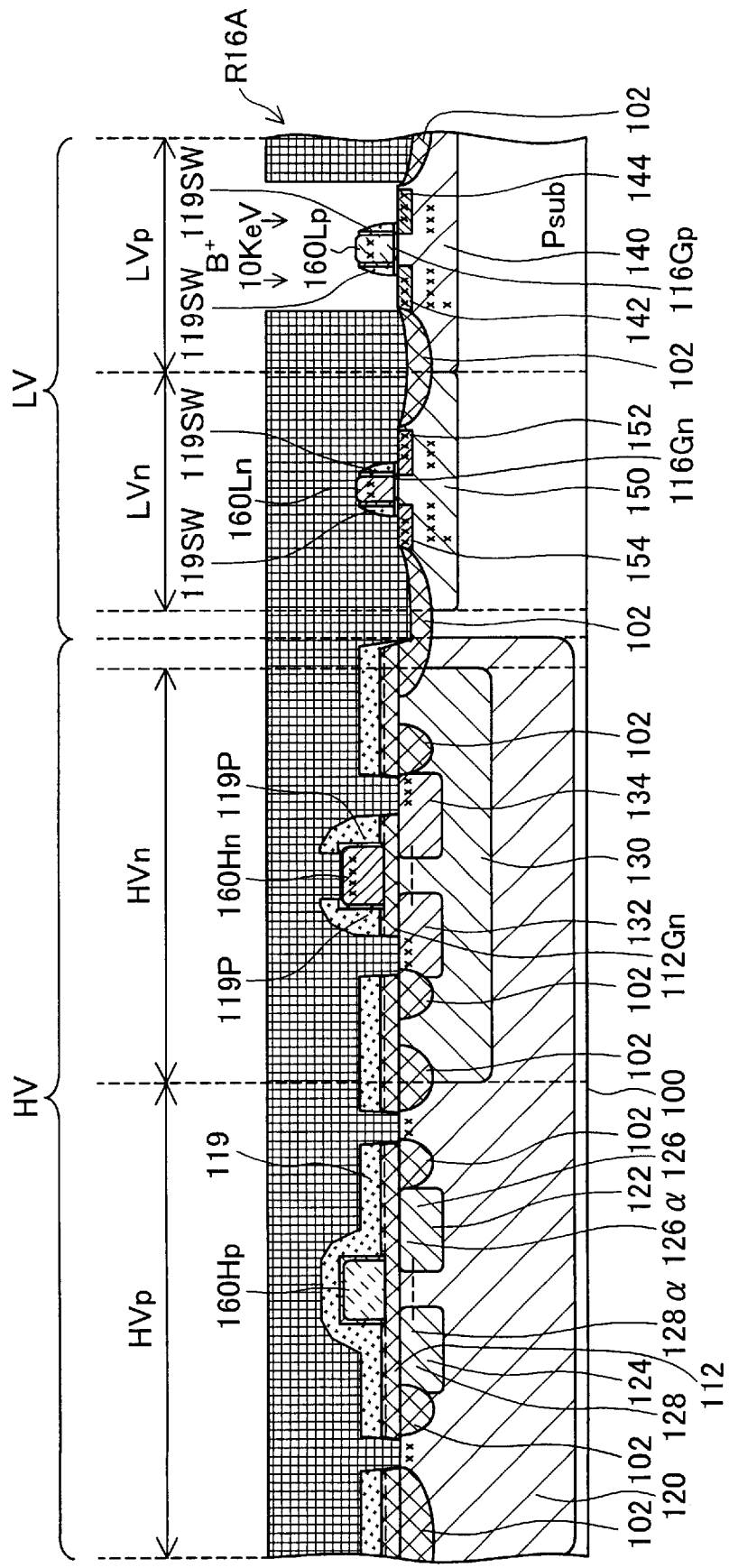
FIG. 38 is a sectional view schematically illustrating a process of specifying a drain area and a source area of a low-breakdown-voltage transistor in the manufacturing method of the embodiment.

FIG. 38 is a sectional view schematically illustrating a process of specifying a drain area and a source area of a low-breakdown-voltage transistor in the manufacturing method of the embodiment. As clearly understood from the comparison with the process of FIG. 25, the sixteenth resist R16 is changed to a resist R16A in the process of FIG. 38. This resist 16A keeps open only the element forming region of the low-breakdown-voltage pMOS area LVp, while covering over the residual area including the element forming region of the high-breakdown-voltage pMOS area HVp. The procedure uses this resist R16A and implants the p-type impurity ion only into the element forming region of the low-breakdown-voltage pMOS area LVp.

Referring to FIG. 38, the concrete procedure forms the resist R16A over the whole area except the element forming region of the low-breakdown-voltage pMOS area LVp, and carries out implantation of the p-type impurity into the element forming region of the low-breakdown-voltage pMOS area LVp with the resist R16A as well as the gate electrode 160Lp and the side walls 119SW as the mask. In this embodiment, boron ion ($B^+$) having an energy level of 10 keV is implanted. This causes the p-type impurity ion to be implanted into a drain-source forming region out of the element forming region of the low-breakdown-voltage pMOS area LVp.

Figure 39:
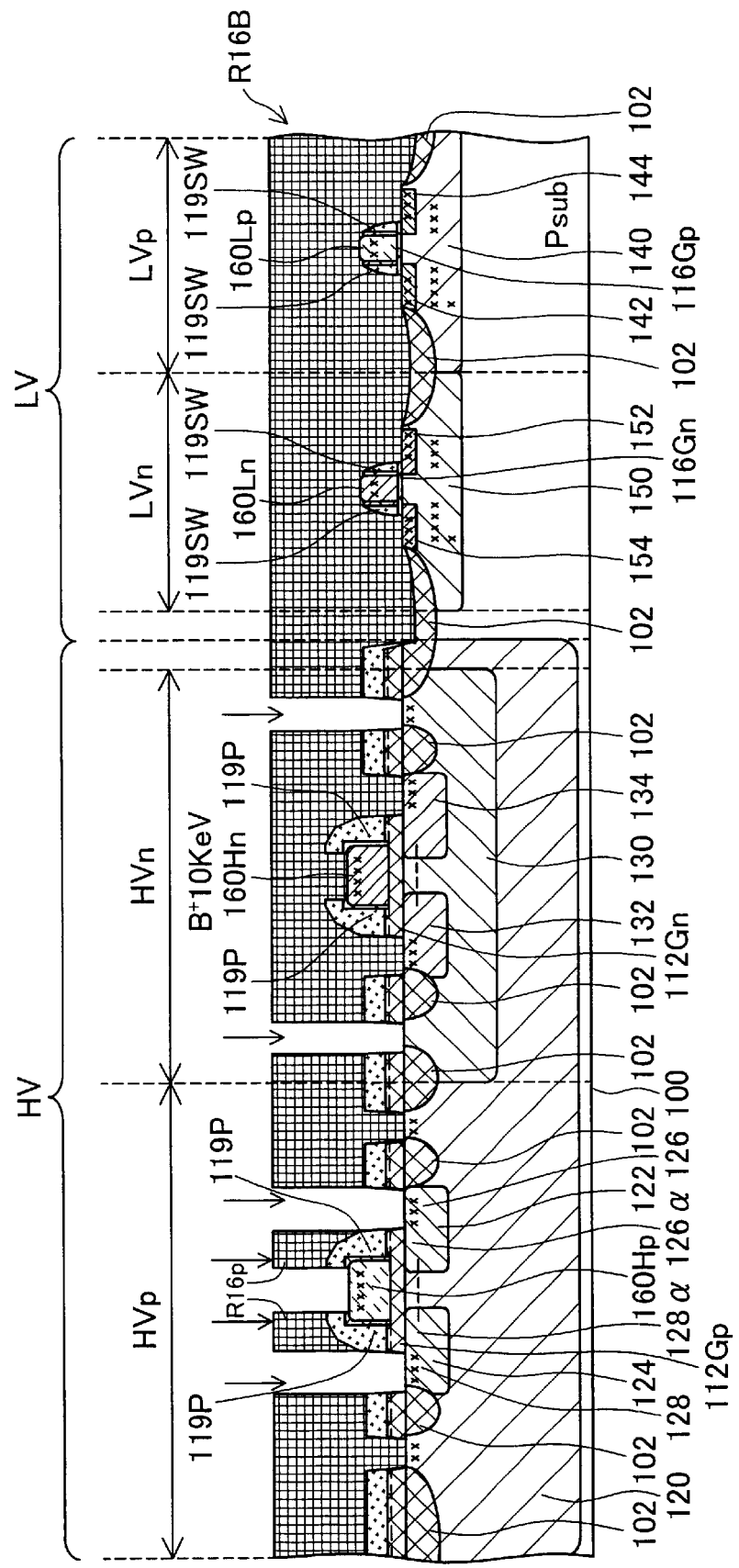
FIG. 39 is a sectional view schematically illustrating a process of specifying a drain area and a source area of a high-breakdown-voltage transistor in the manufacturing method of the embodiment.

FIG. 39 is a sectional view schematically illustrating a process of specifying a drain area and a source area of a high-breakdown-voltage transistor in the manufacturing method of the embodiment. As clearly understood from the comparison with the process of FIG. 25, the sixteenth resist R16 is changed to a resist R16B in the process of FIG. 39. The resist R16B includes a resist R16p, which covers at least the oxide films 119 and 112 in the vicinity of the gate electrode 160Hp of the high-breakdown-voltage pMOS area HVp. The resist R16B also covers the whole surface of the low-breakdown-voltage transistor area LV including the element forming region of the low-breakdown-voltage pMOS area LVp. The procedure of FIG. 39 uses this resist R16B and etches off non-required portions of the sixth oxide film 119 and the second oxide film 112 in the high-breakdown-voltage transistor area HV. This keeps a drain-source forming region and the upper face of the gate electrode 160Hp open in the element forming region of the high-breakdown-voltage pMOS area HVp. The procedure does not remove the resist R16B but continuously uses the same resist R16B, and implants the p-type impurity ion into the open drain-source forming region and gate electrode 160Hp.

Referring to FIG. 39, the concrete procedure forms the resist R16B over the whole area except the element forming region of the high-breakdown-voltage pMOS area HVp, and etches off non-required portions of the sixth oxide film 119 and the second oxide film 112 in the high-breakdown-voltage transistor area HV. This keeps the drain-source forming region and the upper face of the gate electrode 160Hp open in the element forming region of the high-breakdown-voltage pMOS area HVp. A gate oxide film 112Gp is accordingly formed, and a protective oxide film 119 is further formed to cover the gate oxide film 112Gp in the vicinity of the gate electrode 160Hp.

The procedure uses the same resist R16B as the mask and carries out implantation of the p-type impurity ion. In this embodiment, boron ion ($B^+$) having an energy level of 10 keV is implanted. This causes the p-type impurity ion to be implanted into at least the drain-source forming region and the gate electrode 160Hp out of the element forming region of the high-breakdown-voltage pMOS area HVp.

Figure 40:
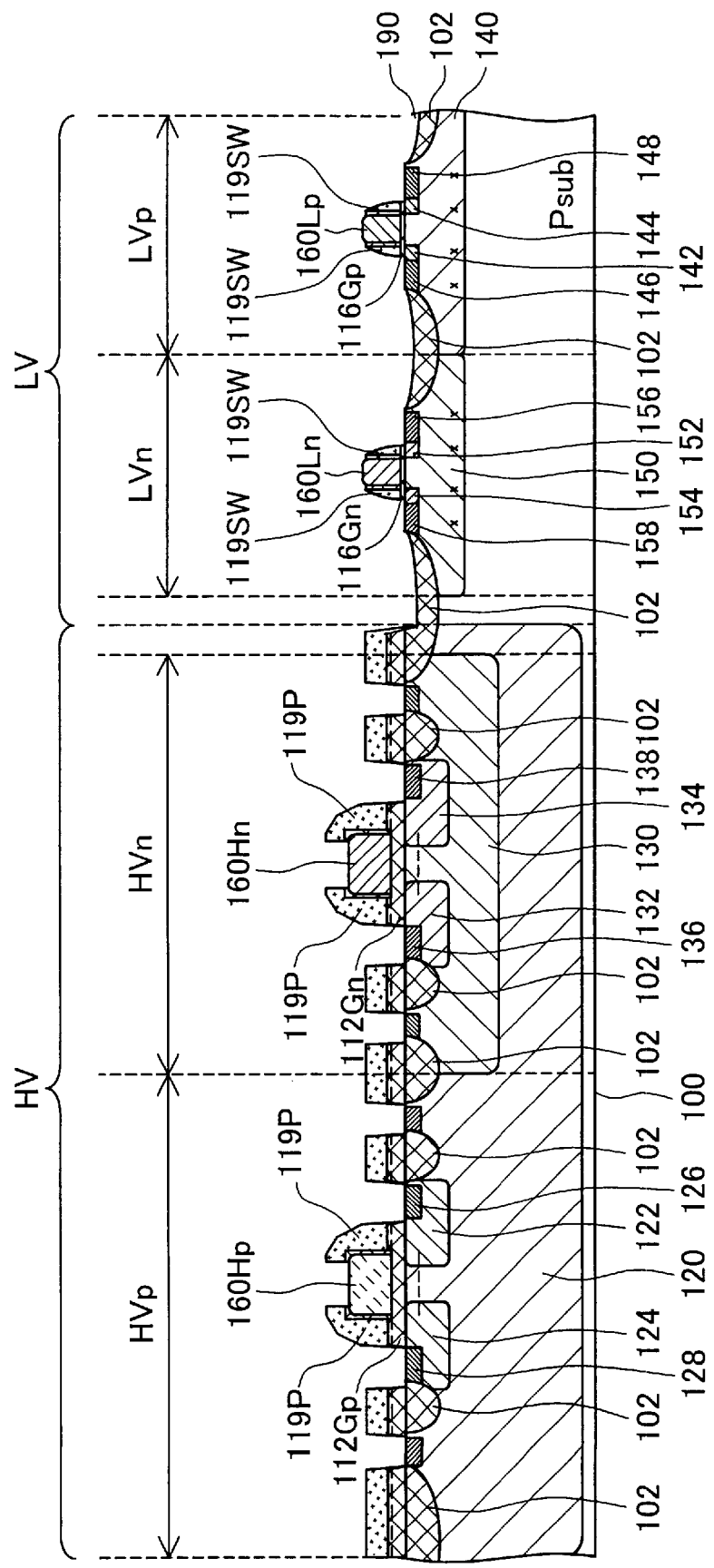
FIG. 40 is a sectional view schematically illustrating the process of specifying the drain areas and the source areas of the high-breakdown-voltage transistor and the low-breakdown-voltage transistor in the manufacturing method of the embodiment.

FIG. 40 is a sectional view schematically illustrating the process of specifying the drain areas and the source areas of the high-breakdown-voltage transistor and the low-breakdown-voltage transistor in the manufacturing method of the embodiment. After completion of implantation of the impurity ions into the low-breakdown-voltage nMOS, the high-breakdown-voltage nMOS, the low-breakdown-voltage pMOS, and the high-breakdown-voltage pMOS in this order, the implanted impurity ions are diffused by high-temperature heat treatment for a long time period. This defines a drain area 126 and a source area 128 of the high-breakdown-voltage pMOS, a drain area 136 and a source area 138 of the high-breakdown-voltage nMOS, a drain area 146 and a source area 148 of the low-breakdown-voltage pMOS, and a drain area 156 and a source area 158 of the low-breakdown-voltage nMOS as shown in FIG. 40.

As described above, the procedure of the embodiment masks the whole high-breakdown-voltage transistor area HV with the seventeenth resist R17 in the process of forming the side walls 119SW shown in FIG. 34. When over-etching is carried out to form the side walls 119SW in the low-breakdown-voltage transistor area LV in the process of FIG. 35, this arrangement effectively prevents a specific portion corresponding to the gate oxide film (that is, a portion encircled by the broken line in FIG. 29 or FIG. 30) in the vicinity of the gate electrode 160Hn or 160Hp from being undesirably thinned in the high-breakdown-voltage transistor area HV.

The manufacturing method of the embodiment has no causes of the problems arising in the basic manufacturing method discussed above. The manufacturing method of the embodiment accordingly keeps from the problem of implanting the impurity ions into the lower layers below the gate oxide films in the vicinity of the gate electrodes 160Hn and 160Hp to define the drain areas and the source areas, as well as from the problem of silicidation of the surface area of the lower layers.

In the process of implantation of the impurity ions shown in FIGS. 37 through 39, the procedure of the embodiment uses the resists R15n and R16p included in the resists R15B and R16B as the mask in the high-breakdown-voltage transistor area HV. These masks effectively prevent the impurity ions from being implanted into the lower layers below the gate oxide films 112Gn and 112Gp in the vicinity of the gate electrodes 160Hn and 160Hp.

The procedure of the embodiment uses the resists R15B and R16B and keeps the drain-source forming regions open in the element forming regions of the high-breakdown-voltage MOS areas in the process of FIGS. 37 through 39. The procedure does not remove the resists R15B and R16B but uses the same resists R15B and R16B and carries out implantation of the impurity ions into the open drain-source forming regions. This arrangement ensures accurate implantation of the impurity ions into the target regions.

The basic manufacturing method discussed above uses the new resists R15 and R16 and implants the impurity ions into the drain-source forming regions in the process of FIGS. 25 and 26, which is several steps after the process of keeping the drain-source forming regions open in the high-breakdown-voltage transistor area HV shown in FIGS. 11 and 12. There is accordingly a possibility of positional shift between the openings of the resists R15 and R16 and the drain-source forming regions. It is accordingly difficult to accurately implant the impurity ions into the drain-source forming regions. The manufacturing method of the embodiment, on the other hand, does not remove the resists R15B and R16B, which are used in the process of keeping open the drain-source forming regions, but continuously uses the same resists R15B and R16B in the process of implantation of the impurity ions into the drain-source forming regions. There is accordingly no possibility of positional shift. The method of the embodiment thus ensures accurate implantation of the impurity ions into the target regions.

The manufacturing method of the embodiment carries out implantation of the impurity ion into the low-breakdown-voltage transistor area LV separately from implantation of the impurity ion into the high-breakdown-voltage transistor area HV. In the process of FIGS. 37 through 39, the whole low-breakdown-voltage transistor area LV including the element forming regions of the low-breakdown-voltage MOS areas is covered with the resists R15B and R16B. The element forming regions of the low-breakdown-voltage MOS areas are not at all affected by etching with the resists R15B and R16B, which is performed to keep open the drain-source forming regions in the element forming regions of the high-breakdown-voltage MOS areas in the process of FIGS. 37 through 39. There is accordingly no possibility that part of the side walls 119SW defined by the oxide films is removed by etching.

In the process of FIGS. 36 through 39, the n-type impurity ion is implanted into the gate electrodes 160Hn and 160Ln of the nMOS, whereas the p-type impurity ion is implanted into the gate electrodes 160Hp and 160Lp of the pMOS. This arrangement desirably lowers the resistance of the respective gate electrodes 160Hn, 160Ln, 160Hp, and 160Lp.

In the process of FIGS. 37 through 39, the procedure of the embodiment also keeps open specific areas interposed between the LOCOS film-parts 102 other than the nMOS- and pMOS-forming regions in the high-breakdown-voltage transistor area HV by etching off the oxide films 119 and 112 with the resists R15B and R16B and implants the impurity ions into these areas with the same resists R15B and R16B. The arrangement of the embodiment thus ensures accurate implantation of the impurity ions into these areas interposed between the LOCOS film-parts 102 and desirably prevents insufficient isolation of the elements.

In the process of FIGS. 37 through 39, the resists R15n and R16p are designed to cover over the peripheral ends of the respective electrodes 160Hn and 160Hp by taking into account the accuracy of dimensions.

The ion implantation process of FIG. 36, the etching and ion implantation process of FIG. 37, the ion implantation process of FIG. 38, and the etching and ion implantation process of FIG. 39 may be carried out in a different order.

After the process of FIG. 40, the manufacturing method of the embodiment silicidates the surface of the drain areas, the gate areas, and the source areas of the respective transistors in the process of FIGS. 27 and 28.

In the method of the embodiment, the gate oxide films 112Gp and 112Gn in the vicinity of the gate electrodes 160Hp and 160Hn in the high-breakdown-voltage transistor area HV are covered with and protected by a protective oxide film 119P, which is composed of the sixth oxide film 119 having a sufficient thickness of approximately 1300 angstrom as shown in FIG. 40. The silicidation process of FIGS. 27 and 28 accordingly does not silicidate the surface regions 136Sα and 138Sα of the lower layers 136α and 138α below the gate oxide films 112Gp and 112Gn in the vicinity of the gate electrodes 160Hn and 160Hp (the regions encircled by the broken line) as shown in FIG. 30.

Figure 41:
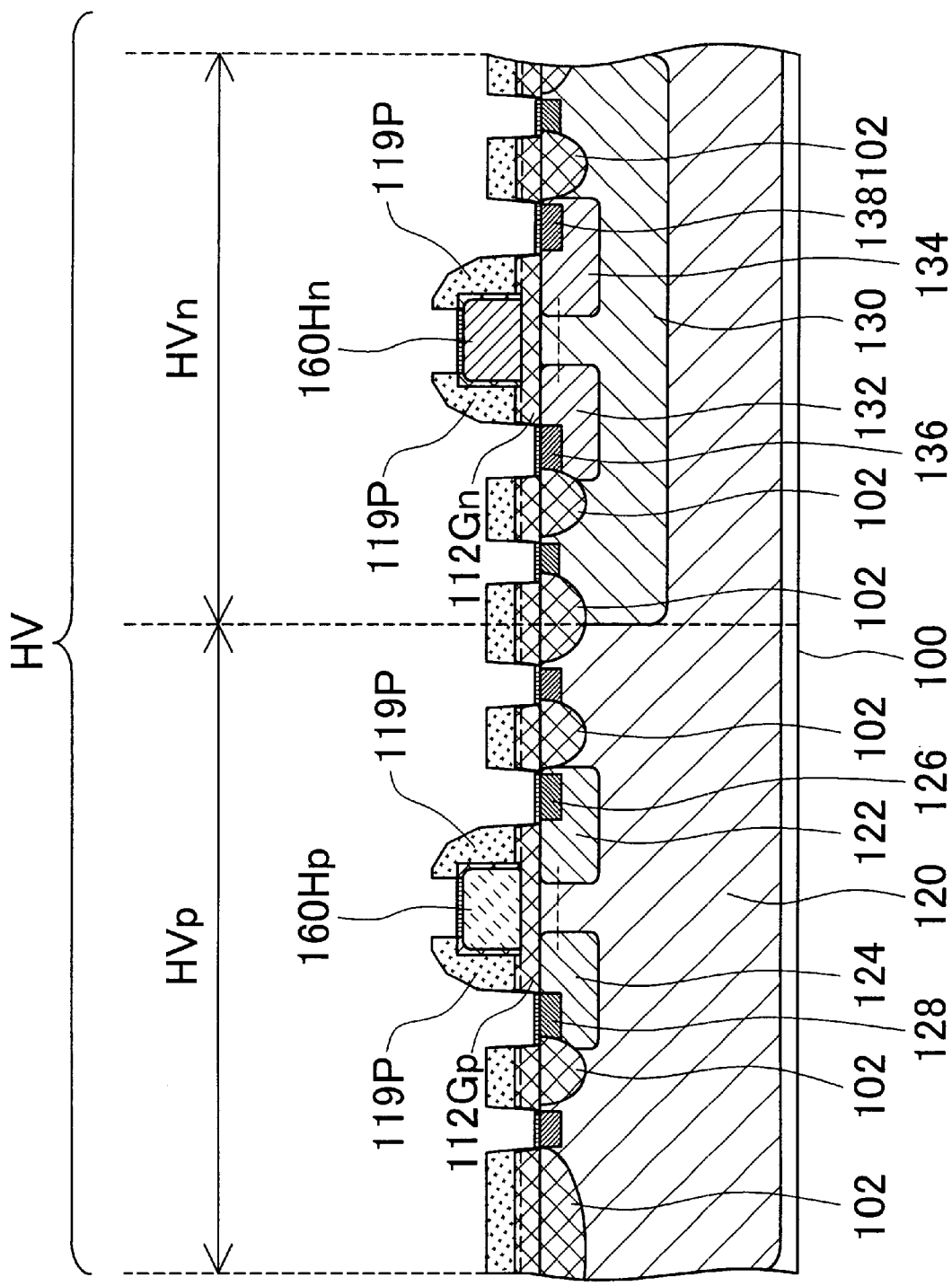
FIG. 41 is a sectional view schematically illustrating a high-breakdown-voltage transistor manufactured by the manufacturing method of the embodiment.

FIG. 41 is a sectional view schematically illustrating a high-breakdown-voltage transistor manufactured according to the manufacturing method of the embodiment. As shown in FIG. 41, in the high-breakdown-voltage transistor area HV, the procedure silicidates the surface of the drain areas 126 and 136 and the source areas 128 and 138 as well as the surface of the gate electrodes 160Hp and 160Hn, which are not covered with the protective oxide film 119P, while not silicidating the part covered with the protective oxide film 119P. This arrangement effectively prevents silicidation of the surface regions of the lower layers below the gate oxide films 112Gp and 112Gn in the vicinity of the gate electrodes 160Hp and 160Hn.

As described above, like the basic manufacturing method discussed above, the manufacturing method of the embodiment enables both the high-breakdown-voltage transistor and the low-breakdown-voltage transistor to be efficiently formed on the identical substrate 100. The manufacturing method of the embodiment effectively prevents a decrease in withstand voltage, which is the problem arising in the high-breakdown-voltage transistor manufactured by the basic manufacturing method.

The above embodiment and its applications are to be considered in all aspects as illustrative and not restrictive. There may be many modifications, changes, and alterations without departing from the scope or spirit of the main characteristics of the present invention. All changes within the meaning and range of equivalency of the claims are therefore intended to be embraced therein.

The scope and spirit of the present invention are indicated by the appended claims, rather than by the foregoing description.

What is claimed is:

1. A method of manufacturing a semiconductor device, in which both a high-breakdown-voltage MOS transistor and a low-breakdown-voltage MOS transistor having different drain breakdown voltages are formed on an identical semiconductor substrate, the manufacturing method comprising the steps of:
   (a) forming a gate electrode on a first dielectric film created above the substrate;
   (b) forming a side wall on a side face of the gate electrode; and
   (c) implanting an impurity to define a drain area and a source area, wherein the step (b) comprises the sub-steps of:
      (b-1) creating a second dielectric film on surface of the substrate including the gate electrode;
      (b-2) forming a first mask, which covers a specific area corresponding to the high-breakdown-voltage MOS transistor; and
      (b-3) using the first mask and etching the second dielectric film, which is located on a certain area corresponding to the low-breakdown-voltage MOS transistor, out of the dielectric films created on the substrate, so as to form the side wall of the second dielectric film on the side face of the gate electrode in the low-breakdown-voltage MOS transistor.

2. A manufacturing method in accordance with claim 1, wherein the step (c) comprises the sub-steps of:
   (c-1) forming a second mask that keeps open at least a drain-source forming region in the high-breakdown-voltage MOS transistor, which is expected to form the drain area and the source area, and the gate electrode but covers at least an offset forming region in the high-breakdown-voltage MOS transistor, which is expected to form an offset area between the gate electrode and either one of the drain area and the source area;
   (c-2) using the second mask and etching off at least the first and the second dielectric films located on the drain-source forming region and the second dielectric film located on the gate electrode, out of the dielectric films created on the substrate; and
   (c-3) continuously using the second mask and implanting the impurity into at least the drain-source forming region and the gate electrode.

3. A manufacturing method in accordance with claim 2, wherein the sub-step (c-1) forms the second mask that covers an element forming region in the low-breakdown-voltage MOS transistor, which is expected to form an element, in addition to the offset forming region,
   the step (c) further comprising the sub-steps of:
      (c-4) forming a third mask, which keeps open at least the element forming region in the low-breakdown-voltage MOS transistor; and
      (c-5) using the third mask and implanting the impurity into at least the element forming region.

4. A manufacturing method in accordance with claim 2, the manufacturing method further comprising the step of:
   (d) forming a metal film on the gate electrode, the drain area, and the source area and carrying out heat treatment, so that at least part of semiconductor layers constructing the gate electrode, the drain area, and the source area is fused to a metal of the metal film and is thereby silicidated.

5. A manufacturing method in accordance with claim 3, the manufacturing method further comprising the step of:
   (d) forming a metal film on the gate electrode, the drain area, and the source area and carrying out heat treatment, so that at least part of semiconductor layers constructing the gate electrode, the drain area, and the source area is fused to a metal of the metal film and is thereby silicidated.

* * * * *